United States Patent
Sakamoto et al.

(10) Patent No.: US 8,280,632 B2
(45) Date of Patent: Oct. 2, 2012

(54) APPARATUS AND METHOD FOR INSPECTING OVERLAPPING FIGURE, AND CHARGED PARTICLE BEAM WRITING APPARATUS

(75) Inventors: Shinji Sakamoto, Kanagawa (JP); Shigehiro Hara, Kanagawa (JP); Hitoshi Higurashi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 512 days.

(21) Appl. No.: 12/392,507

(22) Filed: Feb. 25, 2009

(65) Prior Publication Data

US 2009/0216450 A1    Aug. 27, 2009

(30) Foreign Application Priority Data

Feb. 27, 2008 (JP) ................. 2008-045860

(51) Int. Cl.
  *G06F 19/00* (2011.01)
  *G06F 17/50* (2006.01)
  *G21G 5/00* (2006.01)
(52) U.S. Cl. ............ 702/1; 716/52; 250/492.3
(58) Field of Classification Search .......... 702/1, 66–71, 702/73, 81, 84, 108, 117–118, 123, 127–128, 702/150, 152–153, 155–157, 182–183, 188–189, 702/190–191; 250/492.1–492.3; 382/108, 382/141, 144–145, 147, 149–150, 190, 195; 324/500, 512, 537; 430/5, 21, 24; 716/51–52, 716/55, 111–112, 136; 714/1, 25, 37, 47.1, 714/48
See application file for complete search history.

(56) References Cited

U.S. PATENT DOCUMENTS 7,698,682 B2 * 4/2010 Anpo et al. ............. 716/55

FOREIGN PATENT DOCUMENTS

JP    2005-268657    9/2005

* cited by examiner

*Primary Examiner* — Toan M Le
(74) *Attorney, Agent, or Firm* — Oblon, Spivak, McClelland, Maier & Neustadt, L.L.P.

(57) ABSTRACT

An apparatus for inspecting overlapping figures includes a chip overlap inspection unit configured to input a data file on each chip of a plurality of chips arranged in a writing pattern, and inspect an existence of an overlap between a plurality of chips, based on arrangement data on each region of the plurality of chips, a setting unit configured to set, with respect to the plurality of chips, a plurality of hierarchies and a plurality of cell regions of each of the plurality of hierarchies, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, and an output unit configured to output data on a plurality of figures overlapping.

9 Claims, 24 Drawing Sheets

Writing Layout Region

Overlap Between Array Structure Cell And Single Cell

Overlap Between Array Structure Cells

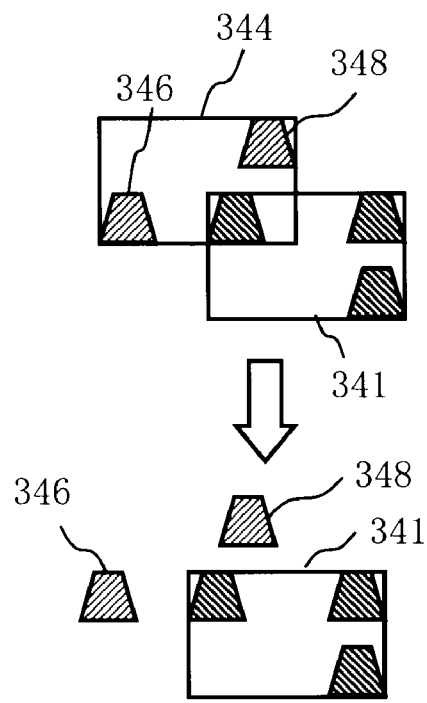
FIG. 22A
FIG. 22B
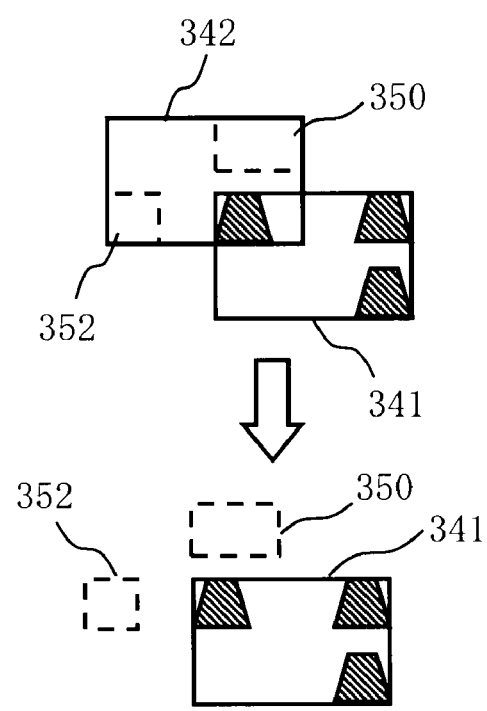
FIG. 23A
FIG. 23B

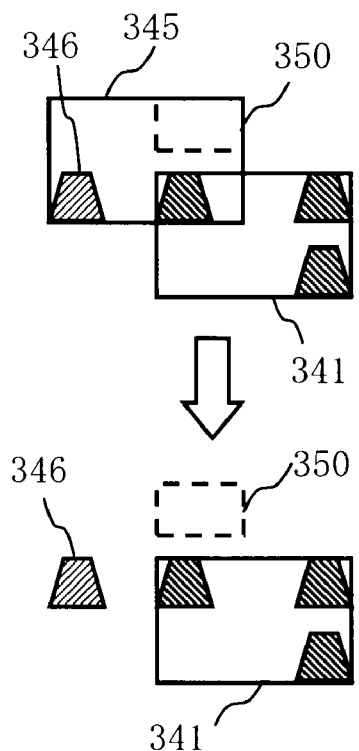
FIG. 24A
FIG. 24B
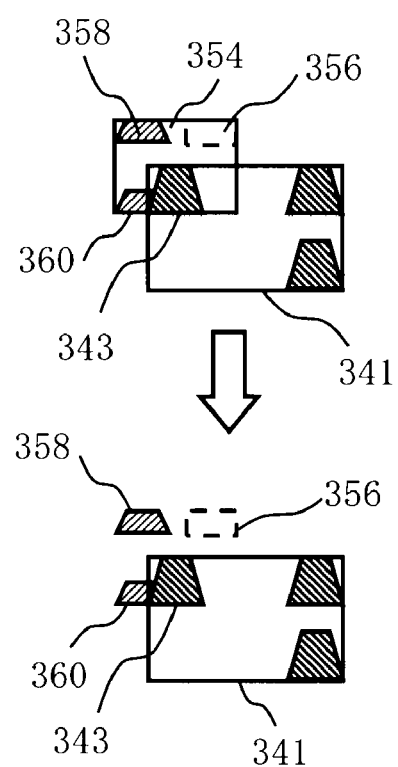
FIG. 25A
FIG. 25B

Related Art

APPARATUS AND METHOD FOR INSPECTING OVERLAPPING FIGURE, AND CHARGED PARTICLE BEAM WRITING APPARATUS

CROSS-REFERENCE TO RELATED APPLICATION

This application is based upon and claims the benefit of priority from the prior Japanese Patent Application No. 2008-045860 filed on Feb. 27, 2008 in Japan, the entire contents of which are incorporated herein by reference.

BACKGROUND OF THE INVENTION

1. Field of the Invention

The present invention relates to an inspection apparatus for inspecting overlapping figures, a charged particle beam writing apparatus, and an extraction method for extracting overlapping figures. For example, it relates to an apparatus and method for inspecting an overlap of figures which is generated between two or more, or a plurality of, chip data defined in writing data used for electron beam writing, and to a writing apparatus in which the above system is installed.

2. Description of Related Art

The lithography technique that advances microscale semiconductor devices is extremely important as being the only process of forming patterns in semiconductor manufacturing processes. In recent years, with high integration of large-scale integrated circuits (LSI), critical dimensions required for semiconductor device circuits are shrinking year by year. In order to form a desired circuit pattern on semiconductor devices, a master pattern (also called a mask or a reticle) of high precision is required. The electron beam writing technique intrinsically having excellent resolution is used for producing such highly precise master patterns.

FIG. 29 is a schematic diagram showing operations of a variable-shaped electron beam (EB) type writing apparatus. As shown in the figure, the variable-shaped electron beam writing apparatus, including two aperture plates, operates as follows: A first aperture plate 410 has a rectangular opening or "hole" 411 for shaping an electron beam 330. This shape of the rectangular opening may also be a square, a rhombus, a rhomboid, etc. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. X direction) during the writing or "drawing." In other words, a rectangular shape formed as a result of passing through both the opening 411 and the variable-shaped opening 421 is written in the writing region of the target workpiece 340 on the stage. This method of forming a given shape by letting beams pass through both the opening 411 and the variable-shaped opening 421 is referred to as a variable shaped method.

When performing the electron beam writing, layout of a semiconductor integrated circuit is first designed, and then, layout data (design data), in which pattern layout is defined, is generated. Then, the layout data is converted into writing data which is adapted to the electron beam writing apparatus. A writing pattern to be written by the electron beam writing apparatus may be composed of a plurality of arranged chips. Chip data used as writing data of each chip is generally stored in separate files. The electron beam pattern writing apparatus inputs the chip data of each chip, reconstructs the chip data to be one chip by merging performed at the position where chips are virtually arranged in the writing region, and writes the reconstructed writing pattern onto the target workpiece.

At this point, if writing is performed in the state that there is an overlap between the arranged figures, it results in a multiple exposure. Therefore, it is necessary to remove such an overlap between the figures beforehand.

FIG. 30 shows an example of the case of an overlap occurring between the figures in one chip. FIG. 30 shows the state in which a part of figures 502 and 504 in a certain region 500 in a chip A are overlapped with each other. Such an overlap can be removed by the fracture processing etc. when generating writing data. Therefore, before inputting writing data into a pattern writing apparatus, such an overlap between figures can be removed in advance. On the other hand, there is a case of an overlap occurring between figures in different chips.

FIG. 31 shows an example of an overlap between figures in different chips. In FIG. 31, figures 512, 514, and 516 are arranged in a certain region 510 in Chip B and figures 522, 524, and 526 are arranged in a certain region 520 in Chip C. In FIG. 31, the chips B and C are arranged in the writing region to be in such a manner that a part of the region 510 of Chip B and the region 520 of Chip C are overlapped with each other. In this case, as shown in FIG. 31, the figure 512 in Chip B and the figure 522 in Chip C may be partially overlapped with each other. In FIG. 31, the overlapped portion is shown in diagonal lines. Conventionally, an effective method to find such an overlap of figures between chips, which is produced when different chips are overlappingly arranged, has not been established. Therefore, when such an overlap of figures between chips occurs, it is not until the writing data is input into the pattern writing apparatus and a plurality of data conversions are performed to generate shot data that the multiple exposure is found. For example, it is not until the stage of checking a beam irradiation amount that the multiple exposure is found. However, even if the multiple exposure is found at this point, the following problems will still occur.

FIG. 32 shows an example of an overlap between figures when merging different chips. In FIG. 32, since the merging is performed at the position where Chips B and C are virtually arranged in the writing region, the figures 512, 514, 516, 522, 524 and 526 are allocated in a merged region 530. That is, at the stage of checking the amount of beam irradiation mentioned above, merging has already been finished. Thus, since the hierarchical structure of chips has already been reconstructed at the stage after merging, even if the overlapped figures 512 and 522 are found after the merging, there is a problem in that great time and effort is needed for investigating in which hierarchical region of which chip each of the figures was allocated.

As to the technique of removing overlapping in order to avoid a double exposure, the following is disclosed in a reference: in the case that a cell repeatedly allocated serves as a character pattern, if another character pattern adjacent to the cell exits, an associated overlap is investigated and an overlapped pattern is not shot, thereby not generating EB shot data (refer to, e.g., Japanese Patent Application Laid-open (JP-A) No. 2005-268657 [0025]). However, the reference concerned is not related to the case of allocating different chips. Thus, no method for inspecting an overlap between figures in the case of different chips being allocated is disclosed or suggested at all.

As mentioned above, when there is an overlap of figures between different chips, an effective method for investigating in which hierarchical region of which chip the figure was allocated before merging has not been established. Therefore, even if overlapped figures are found after merging, there exists a problem that it needs great time and effort to investigate in which hierarchical regions of which chips the figures were allocated.

BRIEF SUMMARY OF THE INVENTION

It is an object of the present invention to provide an inspection apparatus and an inspection method capable of detecting and grasping that in which hierarchical region of which chip each of overlapping figures was allocated.

In accordance with one aspect of the present invention, an apparatus for inspecting overlapping figures includes a chip overlap inspection unit configured to input a data file on each chip of a plurality of chips arranged in a writing pattern, and inspect an existence of an overlap between a plurality of chips, based on arrangement data on each region of the plurality of chips, a setting unit configured to set, with respect to the plurality of chips, a plurality of hierarchies and a plurality of cell regions of each of the plurality of hierarchies, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, and an output unit configured to output data on a plurality of figures overlapping.

In accordance with another aspect of the present invention, an apparatus for inspecting overlapping figures includes a chip overlap inspection unit configured to input a file of data on each chip of a plurality of chips arranged in a writing pattern, and inspect an existence of an overlap between a plurality of chips, based on arrangement data on each region of the plurality of chips, a setting unit configured to set, with respect to the plurality of chips, a plurality of cell regions for each hierarchy of the data on the each chip, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, and an output unit configured to output data on a plurality of figures overlapping.

In accordance with another aspect of the present invention, an apparatus for inspecting overlapping figures includes a chip overlap inspection unit configured to input a data file on each chip of a plurality of chips which are arranged in a writing pattern and in which a plurality of hierarchies and a plurality of cell regions for each of the plurality of hierarchies are defined in such a manner that the plurality of cell regions become smaller in order according to the plurality of hierarchies, and to inspect an existence of an overlap between a plurality of chips, based on arrangement data on each region of the plurality of chips, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, and an output unit configured to output data on a plurality of figures overlapping.

Moreover, in accordance with another aspect of the present invention, a charged particle beam writing apparatus includes a chip overlap inspection unit configured to input a data file on each chip of a plurality of chips arranged in a writing pattern, and inspect an existence of an overlap between a plurality of chips, based on arrangement data on each region of the plurality of chips, a setting unit configured to set, with respect to the plurality of chips, a plurality of hierarchies and a plurality of cell regions of each of the plurality of hierarchies, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, an output unit configured to output data on a plurality of figures overlapping, and a writing unit configured to write a writing pattern in which a plurality of chips having no overlap in a figure hierarchy are arranged, onto a target workpiece by using a charged particle beam.

Moreover, in accordance with another aspect of the present invention, a charged particle beam writing apparatus includes a chip overlap inspection unit configured to input a file of data on each chip of a plurality of chips arranged in a writing pattern, and inspect an existence of an overlap between a plurality of chip regions, based on arrangement data on each region of the plurality of chips, a setting unit configured to set, with respect to the plurality of chips, a plurality of cell regions for each hierarchy of the data on the each chip, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, an output unit configured to output data on a plurality of figures overlapping, and a writing unit configured to write a writing pattern in which a plurality of chips having no overlap in a figure hierarchy are arranged, onto a target workpiece by using a charged particle beam.

Furthermore, in accordance with another aspect of the present invention, a charged particle beam writing apparatus includes a judging unit configured to input a data file on each chip of a plurality of chips which are arranged in a writing pattern and in which a plurality of hierarchies and a plurality of cell regions for each of the plurality of hierarchies are defined in such a manner that the plurality of cell regions become smaller in order according to the plurality of hierarchies, and to judge an existence of an overlap between a plurality of chip regions, based on arrangement data on each region of the plurality of chips, an extraction unit configured to extract, with respect to a plurality of chips where the overlap occurs, a cell region where the overlap is located, from a higher hierarchy level to a lower hierarchy level in order, a figure overlap judging unit configured to judge an existence of an overlap between a figure in the cell region extracted and a figure in the other cell region extracted, an output unit configured to output data on a plurality of figures overlapping, and a writing unit configured to write a writing pattern in which a plurality of chips having no overlap in a figure hierarchy are arranged, onto a target workpiece by using a charged particle beam.

Furthermore, in accordance with another aspect of the present invention, a method for inspecting overlapping figures includes inputting a data file on each chip of a plurality of chips arranged in a writing pattern, and inspecting an existence of an overlap between a plurality of chips, based on arrangement data on each region of the plurality of chips, setting, with respect to the plurality of chips, a plurality of hierarchies and a plurality of cell regions of each of the plurality of hierarchies, extracting, with respect to a plurality of chips where the overlap occurs, a cell region where the overlap is located, from a higher hierarchy level to a lower hierarchy level in order, judging an existence of an overlap between a figure in the cell region extracted and a figure in the other cell region extracted, and outputting data on a plurality of figures overlapping.

Furthermore, in accordance with another aspect of the present invention, a method for inspecting overlapping figures includes inputting a file of data on each chip of a plurality of chips arranged in a writing pattern, and inspecting an existence of an overlap between a plurality of chips, based on arrangement data on each region of the plurality of chips, setting, with respect to the plurality of chips, a plurality of cell regions for each hierarchy of the data on the each chip, extracting, with respect to a plurality of chips where the overlap occurs, a cell region where the overlap is located, from a higher hierarchy level to a lower hierarchy level in order, judging an existence of an overlap between a figure in the cell region extracted and a figure in the other cell region extracted, and outputting data on a plurality of figures overlapping.

Furthermore, in accordance with another aspect of the present invention, a method for inspecting overlapping figures includes inputting a data file on each chip of a plurality of chips which are arranged in a writing pattern and in which a plurality of hierarchies and a plurality of cell regions for each of the plurality of hierarchies are defined in such a manner that the plurality of cell regions become smaller in order according to the plurality of hierarchies, and judging an existence of an overlap between a plurality of chip regions, based on arrangement data on each region of the plurality of chips, extracting, with respect to a plurality of chips where the overlap occurs, a cell region where the overlap is located, from a higher hierarchy level to a lower hierarchy level in order, judging an existence of an overlap between a figure in the cell region extracted and a figure in the other cell region extracted, and outputting data on a plurality of figures overlapping.

BRIEF DESCRIPTION OF THE DRAWINGS

FIGS. 22A and 22B show an example of inspecting an overlap between a cell and a figure according to Embodiment 1;

FIGS. 23A and 23B show an example of inspecting an overlap between a cell and another cell of a higher hierarchy level according to Embodiment 1;

FIGS. 24A and 24B show another example of inspecting an overlap between a cell and another cell of a higher hierarchy level according to Embodiment 1;

FIGS. 25A and 25B show another example of inspecting an overlap between a cell and another cell of a higher hierarchy level according to Embodiment 1;

DETAILED DESCRIPTION OF THE INVENTION

Embodiment 1

According to Embodiment 1 below, a structure utilizing an electron beam as an example of a charged particle beam will be described. The charged particle beam is not limited to the electron beam. Another charged particle beam, such as an ion beam, may also be used. As an example of a charged particle beam apparatus, a charged particle beam writing apparatus, particularly a variable shaped type electron beam writing apparatus will be described.

Figure 1:
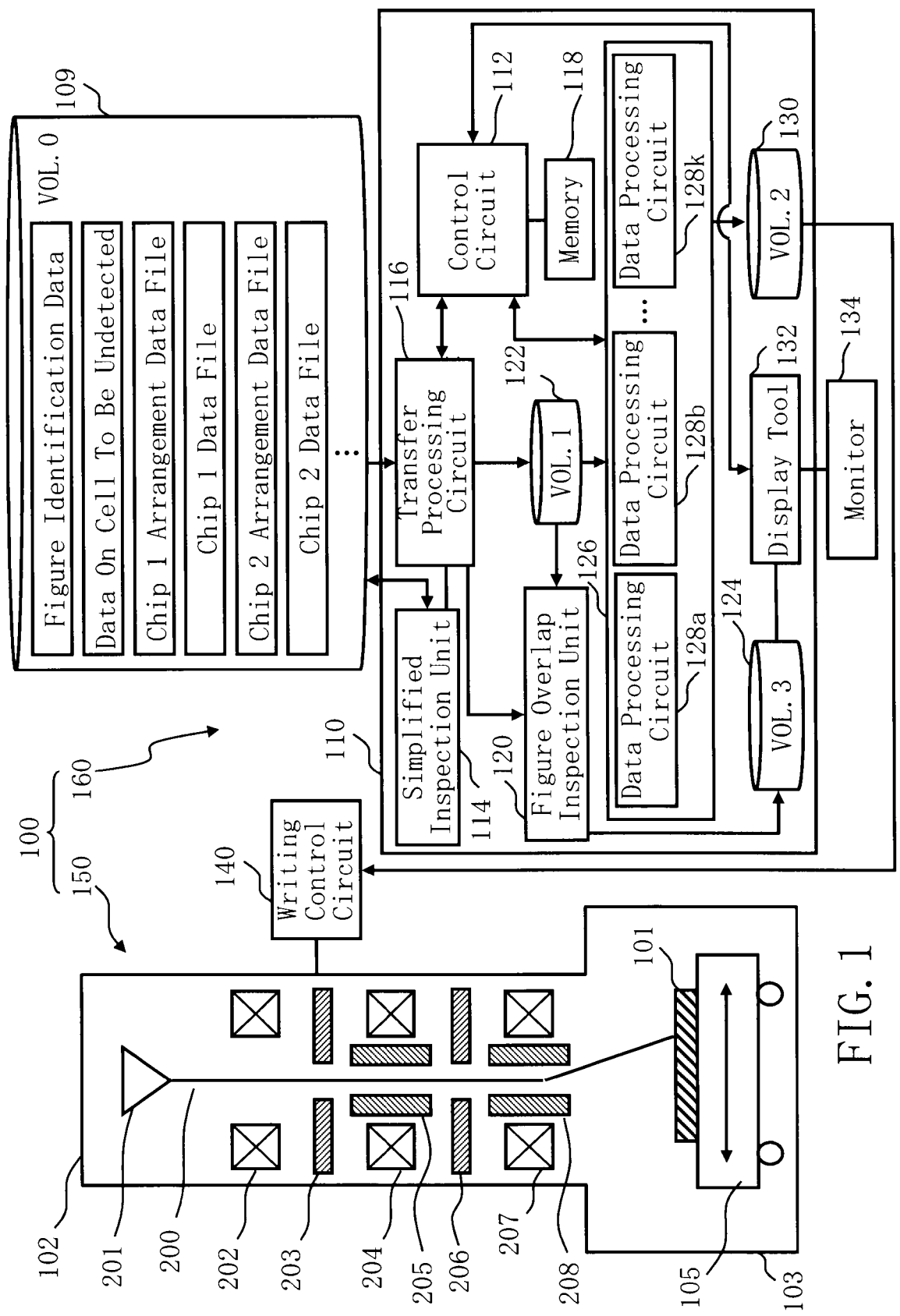
FIG. 1 is a schematic diagram showing the structure of a pattern writing apparatus according to Embodiment 1.

FIG. 1 is a schematic diagram showing the structure of a pattern writing apparatus according to Embodiment 1. In FIG. 1, a pattern writing apparatus 100 is an example of an electron beam pattern writing apparatus. The pattern writing apparatus 100 writes a predetermined pattern onto a target workpiece 101. The target workpiece 101 may be an exposure mask for use in a lithography step in a semiconductor device manufacturing process or may be a glass substrate for the exposure mask. The pattern writing apparatus 100 includes a writing unit 150 and a control unit 160. The writing unit 150 includes a writing chamber 103 and an electron lens barrel 102 arranged at the upper part of the writing chamber 103. In the electron lens barrel 102, there are an electron gun assembly 201, an illumination lens 202, a first aperture plate 203, a projection lens 204, a deflector 205, a second aperture plate 206, an objective lens 207, and a deflector 208. In the writing chamber 103, there is arranged an XY stage 105, on which the target workpiece 101 serving as a writing object is placed. The control unit 160 includes a control unit 110, a writing control circuit 140, and a monitor 134. The control unit 110, the writing control circuit 140, and the monitor 134 are connected with each other by a bus (not shown). The control unit 110 serves as an example of an inspection apparatus for inspecting overlapped figures. The control unit 110 includes a control circuit 112, a simplified inspection unit 114, a transfer processing circuit 116, a memory 118, a figure overlap inspection unit 120, magnetic disk drives 122, 124, and 130, a plurality of data processing circuits 128a, 128b ... 128k, and a display tool 132. A data processing circuit group 126 is composed of these data processing circuits 128a to 128k. Each structure element in the control unit 110 is connected with each other by a bus (not shown). In an external magnetic disk drive 109, a plurality of chip arrangement data files and a plurality of chip data files are stored. Moreover, in the magnetic disk drive 109, related data on undetection, such as data on a cell to be undetected and figure identification data, is stored. While FIG. 1 shows only the structure elements necessary for explaining Embodiment 1, it should be understood that other structure elements generally necessary for the writing apparatus 100 may also be included.

When writing with an electron beam, layout of a semiconductor integrated circuit is first designed, and then data in which pattern layout is defined is generated. At this stage, the data is still generated as layout data for each chip. This layout data is stored in the magnetic disk drive 109, as a chip arrangement data file in which arrangement data of a chip is defined and a chip data file in which pattern data in a chip is defined. Then, patterns in these plurality of chips are arranged in one writing region, to be written onto the target workpiece 101 by the pattern writing apparatus 100.

Figure 2:
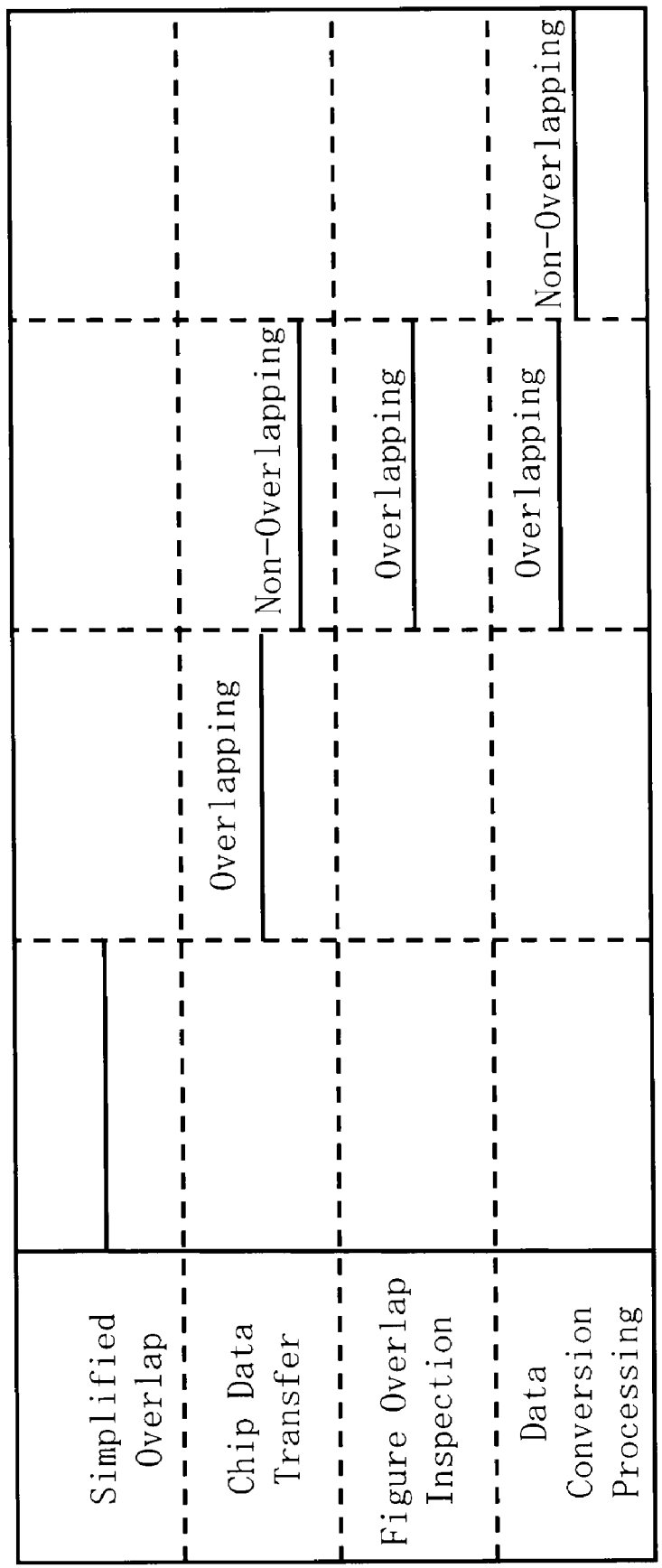
FIG. 2 shows a data processing flow in a control unit according to Embodiment 1.

According to Embodiment 1, when writing patterns of these plurality of chips, since different chips are overlapped with each other, an overlap of figures constituting the patterns in different chips needs to be inspected. This inspection is conducted in real time before merging chips, that is during data processing for writing and during a writing operation. In order to achieve this inspection, efficient data processing is performed as follows:

FIG. 2 shows a data processing flow in a control unit according to Embodiment 1. In FIG. 2, a simplified overlap inspection, a chip data transfer, a figure overlap inspection, and data conversion processing are performed in the control unit 110. The simplified overlap inspection, chip data transfer, and figure overlap inspection are executed to be in pipeline processing. Moreover, the three processes of transferring chip data, inspecting a figure overlap, and converting data, or at least two processes of them are executed to be in parallel.

Thus, by proceeding the data processing to be in pipeline processing or parallel processing, it is possible to improve the processing efficiency. Consequently, even in the case of writing data of a great amount, it is possible to perform a figure overlap inspection, data processing for writing, and a writing operation in real time.

Figure 3:
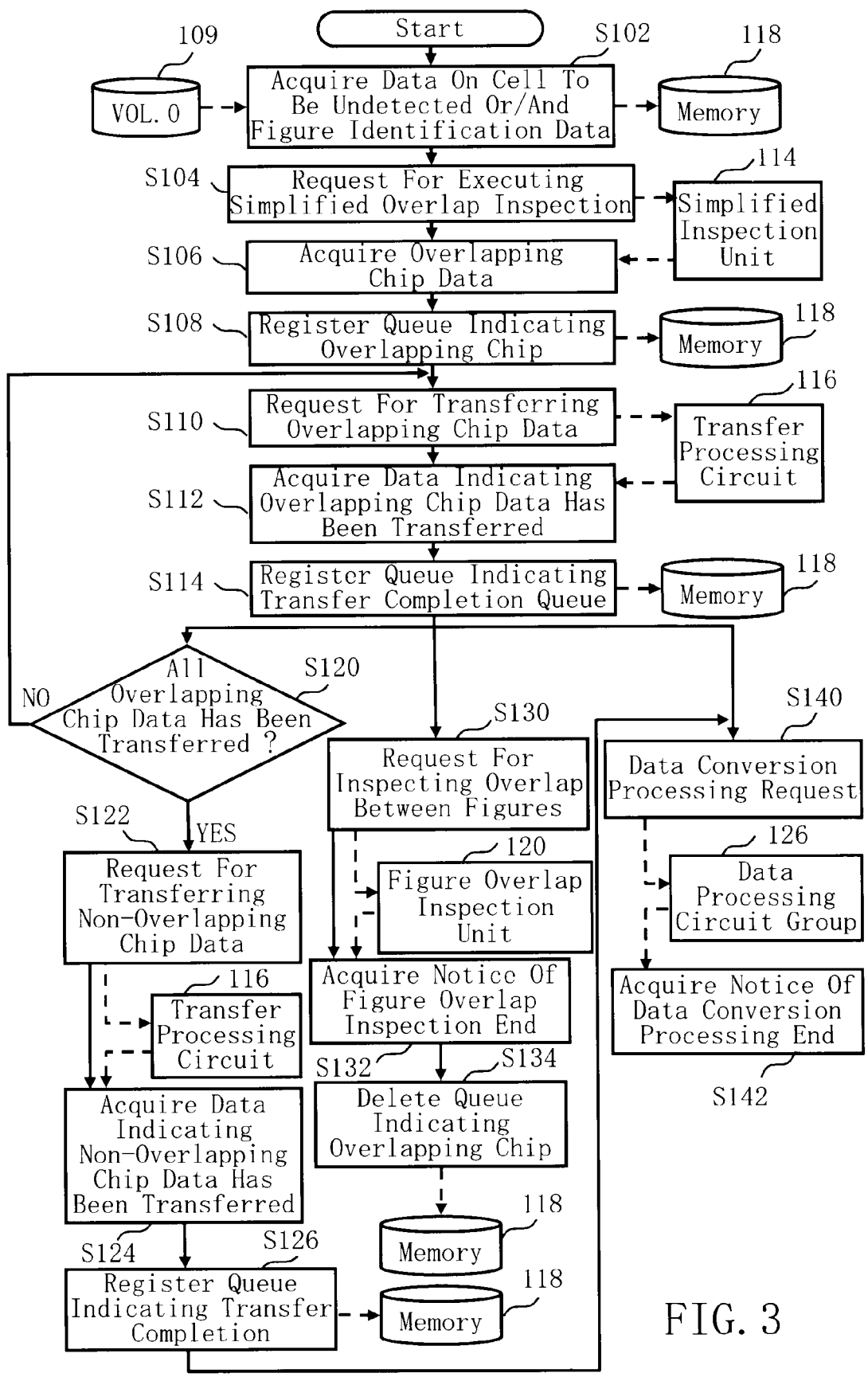
FIG. 3 is a flowchart showing operations of the control circuit according to Embodiment 1.

FIG. 3 is a flowchart showing operations of the control circuit according to Embodiment 1. In step S102, as an acquisition step of data on a cell to be undetected or/and figure identification data, the control circuit 112 acquires data on a cell to be undetected or/and figure identification data from the magnetic disk drive 109. There may be a case of intentionally arranging cells or figures overlappingly depending upon layout. In order not to detect such cells or figures which are allowed to be overlapped, data on them is acquired in advance. If the original chip data has a hierarchical structure, cells allowed to be overlapped can be identified. Then, a cell to be undetected can be specified according to data on cells to be undetected. Moreover, when specifying a figure allowed to be overlapped, it is possible to identify the figure to be undetected based on figure identification data. However, there may be a case that the original chip data has no hierarchical structure. In such a case, since a cell allowed to be overlapped cannot be identified, what is necessary is, with respect to a figure allowed to be overlapped, to specify a figure to be undetected based on figure identification data. Thus, depending upon the existence of a hierarchical structure, it needs to acquire data on a cell to be undetected or/and figure identification data.

Figure 4:
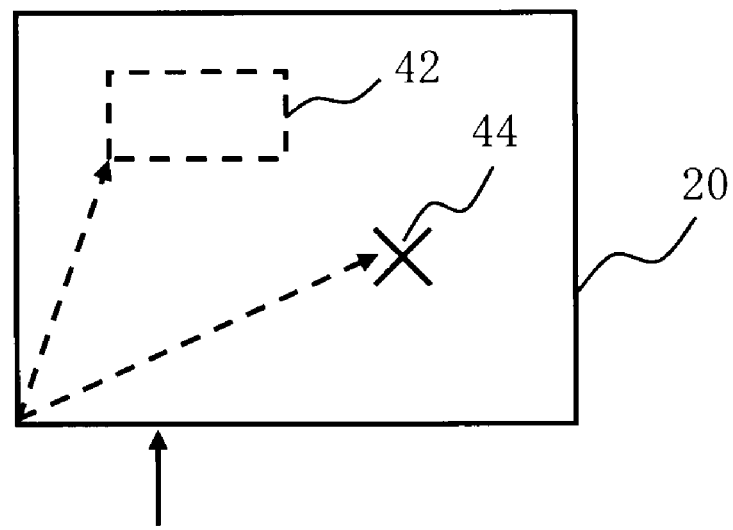
FIG. 4 is a schematic diagram for explaining an example of figure identification data according to Embodiment 1.

FIG. 4 is a schematic diagram for explaining an example of figure identification data according to Embodiment 1. In FIG. 4, when a region 42 to be undetected has been specified in a writing layout region 20, what is necessary is to set the coordinates and size of the reference position of the region 42 to be undetected. Alternatively, it is also preferable to set two coordinates (e.g., lower left coordinates and upper right coordinates) at the diagonal positions of the region 42 to be undetected. Moreover, when a point 44 to be undetected has been specified, it is enough just to set the coordinates of the point 44 to be undetected.

Figure 5:
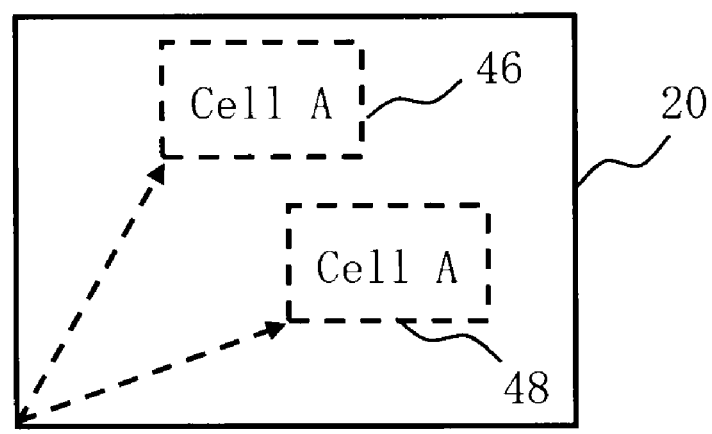
FIG. 5 is a schematic diagram for explaining an example of data on a cell to be undetected according to Embodiment 1.

FIG. 5 is a schematic diagram for explaining an example of data on a cell to be undetected according to Embodiment 1. In FIG. 5, when cells 46 and 48 to be undetected have been specified in the writing layout region 20, it is enough to set the cell name, the cell number, or the cell arrangement coordinates, etc. of the cells 46 and 48. In FIG. 5, the cells 46 and 48 to be undetected are denoted by a cell name "Cell A".

Figure 6:
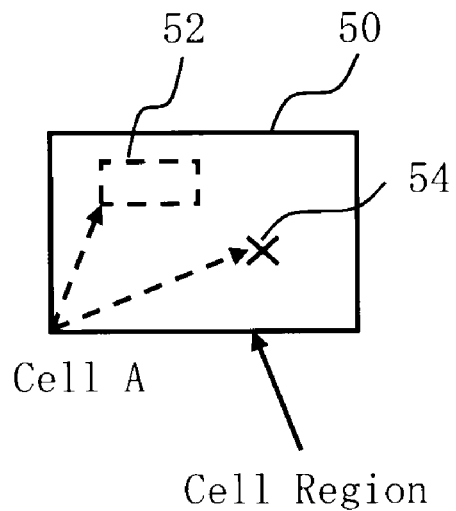
FIG. 6 is a schematic diagram for explaining an example of a figure to be undetected in a specification cell according to Embodiment 1.
Figure 7:
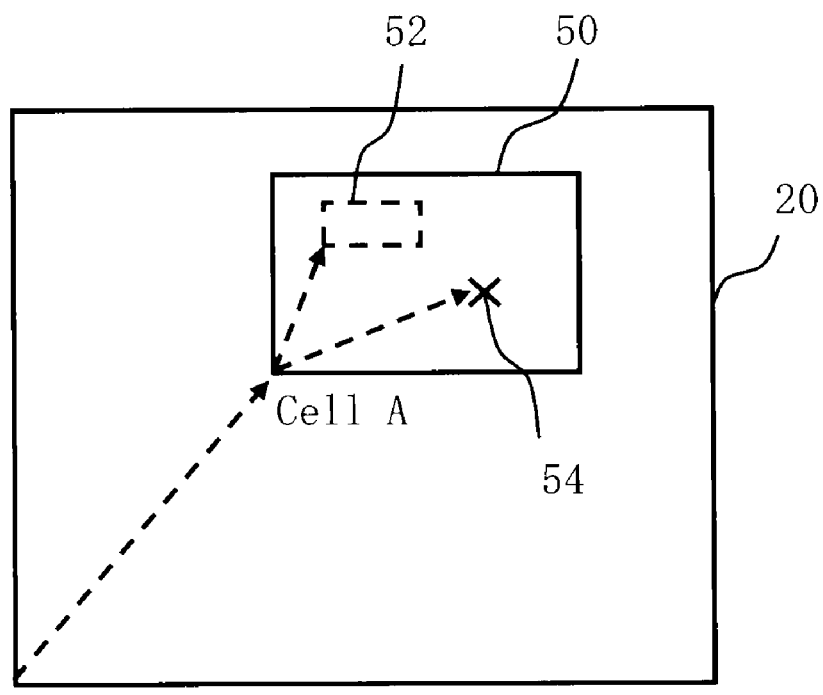
FIG. 7 is a schematic diagram for explaining an example of figure identification data in a specification cell according to Embodiment 1.

FIG. 6 is a schematic diagram for explaining an example of a figure to be undetected in a specification cell according to Embodiment 1. FIG. 7 is a schematic diagram for explaining an example of figure identification data in a specification cell according to Embodiment 1. As shown in FIG. 6, there is a case in which a region 52 to be undetected or a point 54 to be undetected has been specified in a certain specification cell 50. In such a case, if the region 52 to be undetected in the specification cell 50 has been specified as shown in FIG. 7, what is necessary is to set the cell name, cell number, or cell arrangement coordinates, etc. of the specification cell 50, and the coordinates of the reference position and the size of the region 52 to be undetected, in the writing layout region 20. Alternatively, as shown in FIG. 7, it is also preferable to set the cell name, cell number or cell arrangement coordinates, etc. of the specification cell 50, and two coordinates (e.g., lower left coordinates and upper right coordinates) at the diagonal positions of the region 52 to be undetected, in the writing layout region 20. Moreover, when the point 54 to be undetected in the specification cell 50 has been specified as shown in FIG. 7, it is enough just to set the cell name, cell number, or cell arrangement coordinates, etc. of the specification cell 50, and the coordinates of the point 44 to be undetected, in the writing layout region 20.

The acquired data on a cell to be undetected or/and figure identification data are stored in the memory 118.

Figure 8:
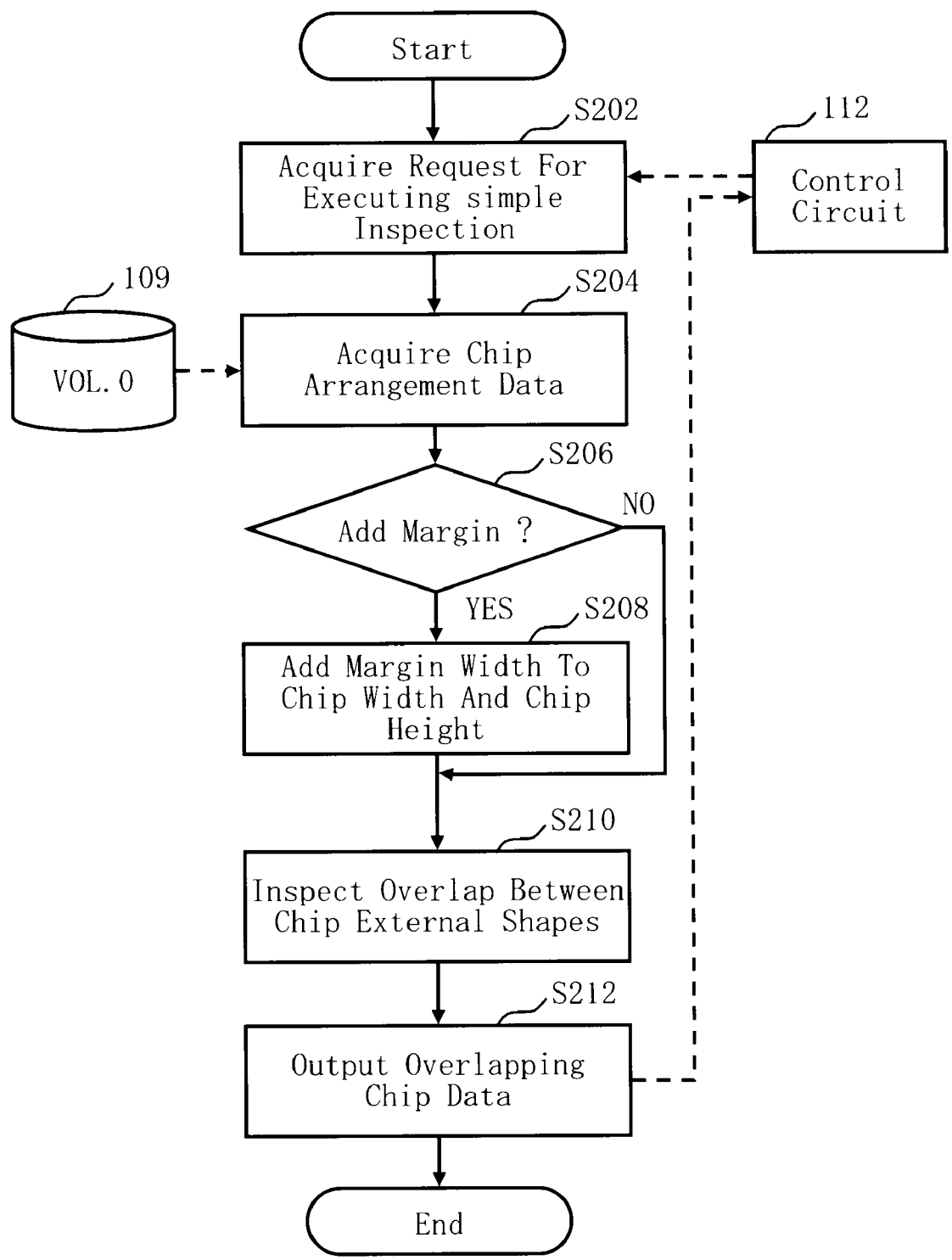
FIG. 8 is a flowchart showing main steps of a method of a simplified overlap inspection according to Embodiment 1.

In step S104, the control circuit 112 outputs a request for executing a simplified overlap inspection to the simplified inspection unit 114. In response to the request for executing a simplified overlap inspection from the control circuit 112, the simplified inspection unit 114 performs a simplified overlap inspection as follows:

FIG. 8 is a flowchart showing main steps of a method of a simplified overlap inspection according to Embodiment 1. In step S202, the simplified inspection unit 114 acquires the request for executing a simplified overlap inspection from the control circuit 112.

In step S204, the simplified inspection unit 114 reads a chip arrangement data file, stored for each chip, from the magnetic disk drive 109 one by one. The simplified inspection unit 114 acquires chip arrangement data on each chip defined in each chip arrangement data file.

Figure 9:
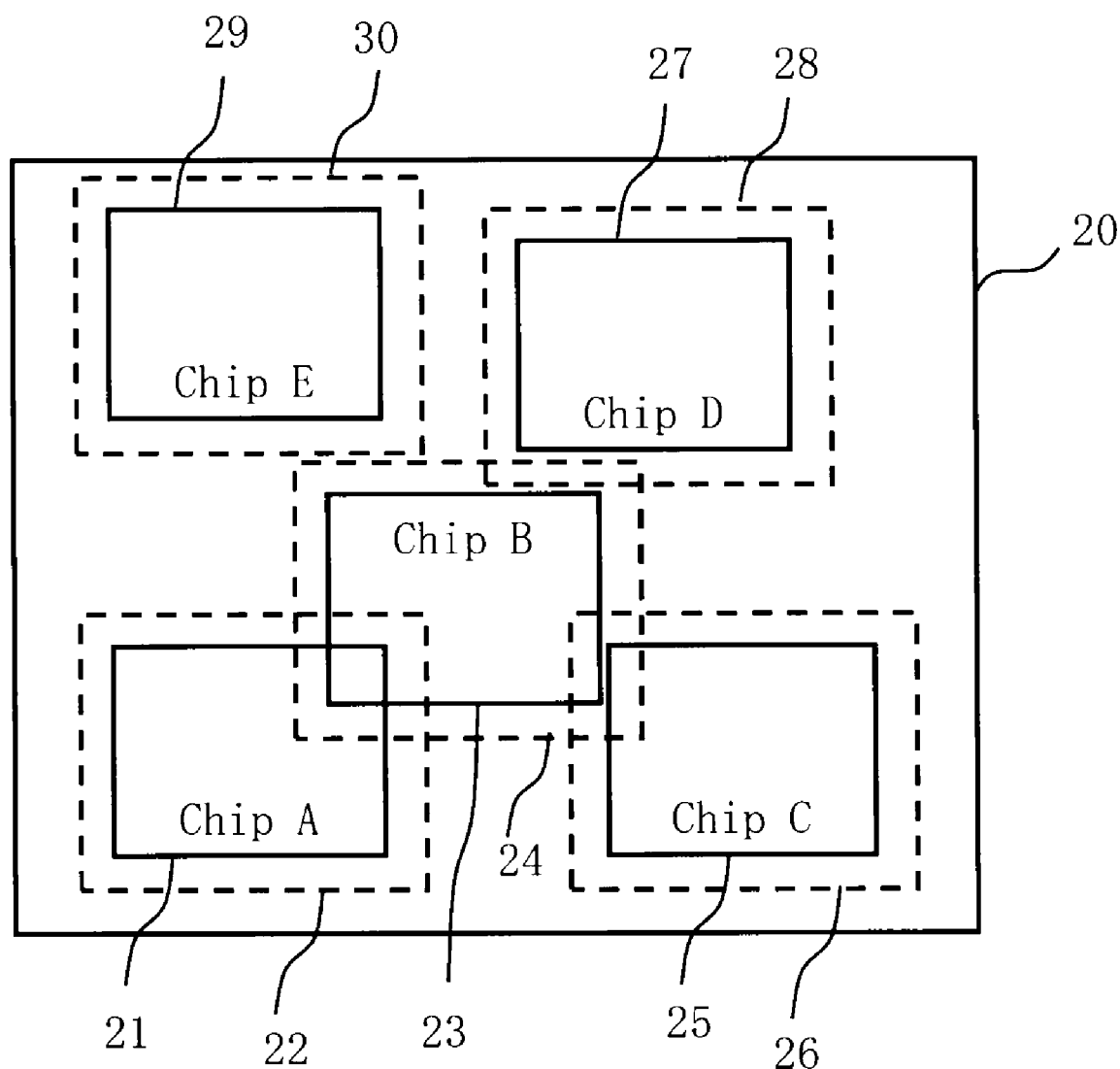
FIG. 9 is a schematic diagram showing an example of chip arrangement according to Embodiment 1.

FIG. 9 is a schematic diagram showing an example of chip arrangement according to Embodiment 1. In FIG. 9, chips A to E are arranged in the writing layout region 20. The solid lines show external frames of the chips. The dotted lines show margin frames of the chips to which a margin width is added. In FIG. 9, the arrangement position of Chip A is shown by the position where a chip external frame 21 is allocated. The arrangement position of Chip B is shown by the position where a chip external frame 23 is allocated. The arrangement position of Chip C is shown by the position where a chip external frame 25 is allocated. The arrangement position of Chip D is shown by the position where a chip external frame 27 is allocated. The arrangement position of Chip E is shown by the position where a chip external frame 29 is allocated.

In step S206, the simplified inspection unit 114 judges whether a margin is to be added or not. The margin width is needed to set beforehand. For example, it is preferable to store the margin width in the memory 118. In such a case, the simplified inspection unit 114 refers to the data stored in the memory 118, and judges to add a margin if the margin width has been set, and judges not to add it if the margin width has not been set. It is also preferable to store a margin width in the magnetic disk drive 109 instead of the memory 118. In such a case, the simplified inspection unit 114 refers to the data stored in the magnetic disk drive 109. When judged to add a margin, it goes to S208, and when judged not to add it, it goes to S210.

In step S208, the simplified inspection unit 114 adds the margin width which has been set, i.e. the chip height and the chip width, to the outside of the chip external frame. FIG. 9 shows the arrangement state of Chip A, where the margin width denoted by a margin frame 22 is added, the arrangement state of Chip B, where the margin width denoted by a margin frame 24 is added, the arrangement state of Chip C, where the margin width denoted by a margin frame 26 is added, the arrangement state of Chip D, where the margin width denoted by a margin frame 28 is added, and the arrangement state of Chip E, where the margin width denoted by a margin frame 30 is added.

In step S210, the simplified inspection unit 114 inspects an overlap between chip external shapes. The inspection on an overlap between chip external shapes is to inspect whether a part overlapping each other exists between the chip external frames, like the arrangement relation between Chip A and Chip B. Alternatively, even when there is no part overlapping each other between the chip external frames, like the arrangement relation between Chip B and Chip C, if a part overlapping each other exists between the chip external margin of one chip and the margin frame of the other chip, it may be judged to be overlapping. Alternatively, it may inspect whether there is an overlap only between the margin frame of one chip and the margin frame of the other chip, like the arrangement relation between Chip B and Chip D. Anyhow, in the case of there being no overlap between the chip margin frames, like the arrangement relation between Chip B and Chip E, it is judged to be "not overlapping".

In step S212, as a result of the inspection, the simplified inspection unit 114 generates overlapping chip data on the chips which are overlapped with each other, and outputs it to the control circuit 112

As mentioned above, chips whose chip external frames or margin frames are overlapping each other are extracted by the inspection. At the stage of the end of the simplified overlap inspection, it has not been revealed that there is an overlap between which figures in the chip or there is no overlap. An overlap of figures between different chips will be made clear by another inspection mentioned later. In the simplified overlap inspection, it is enough just to extract chips with possibility of having an overlap of figures between different chips. That is, by this simplified overlap inspection, chips with possibility of having an overlap of figures can be selected from other chips. Therefore, compared with the case of performing an inspection on an overlap between figures to all the chips, it is possible to greatly reduce the time and effort of the inspection.

In step S106 of FIG. 3, the control circuit 112 acquires overlapping chip data from the simplified inspection unit 114.

In step S108, the control circuit 112 registers an overlapping chip queue indicating an overlapping chip. Then, the overlapping chip queue is stored in the memory 118.

Figure 10:
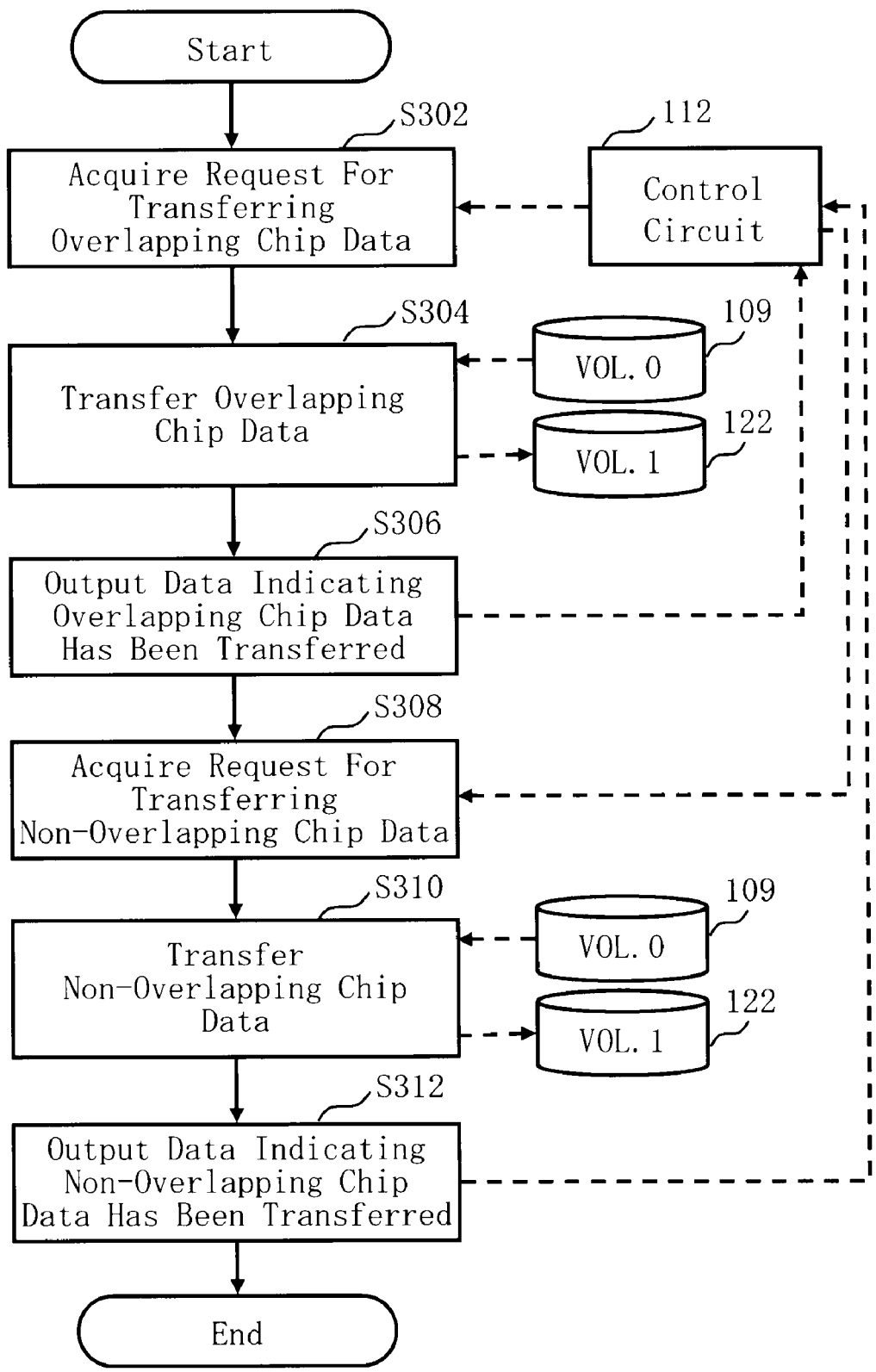
FIG. 10 is a flowchart showing main steps of a data transfer method according to Embodiment 1.

In step S110, the control circuit 112 outputs a request for transferring overlapping chip data to the transfer processing circuit 116. In response to the request for transferring overlapping chip data from the control circuit 112, the transfer processing circuit 116 performs data transfer as follows:

FIG. 10 is a flowchart showing main steps of a data transfer method according to Embodiment 1. In step S302, the transfer processing circuit 116 acquires the request for transferring overlapping chip data from the control circuit 112.

In step S304, the transfer processing circuit 116 selects a chip data file corresponding to an overlapped chip from the magnetic disk drive 109, and transmits it to the magnetic disk drive 122. That is, when overlapped chips exist, at least two chip data files are transmitted.

In step S306, each time when the transfer of the chip data file corresponding to an overlapped chip is completed, the transfer processing circuit 116 outputs data indicating that overlapping chip data has been transferred, to the control circuit 112.

As mentioned above, first, a chip data file on each chip corresponding to an overlapped chip is transferred.

In step S112 of FIG. 3, the control circuit 112 acquires the data indicating that overlapping chip data has been transferred, from the transfer processing circuit 116.

In step S114, the control circuit 112 registers a transfer completion queue indicating a transfer completion concerning an overlapping chip. Then, the transfer completion queue is stored in the memory 118.

In step S120, the control circuit 112 judges whether all the overlapping chip data has been transferred or not. If overlapping chip data which has not been transferred yet exists, it returns to S110. If all the overlapping chip data has been transferred, it goes to S122.

When overlapping chip data is transferred to the magnetic disk drive 122, the figure overlap inspection and the data conversion processing shown in FIG. 2 are performed in parallel. First, the figure overlap inspection will now be explained.

Figure 11:
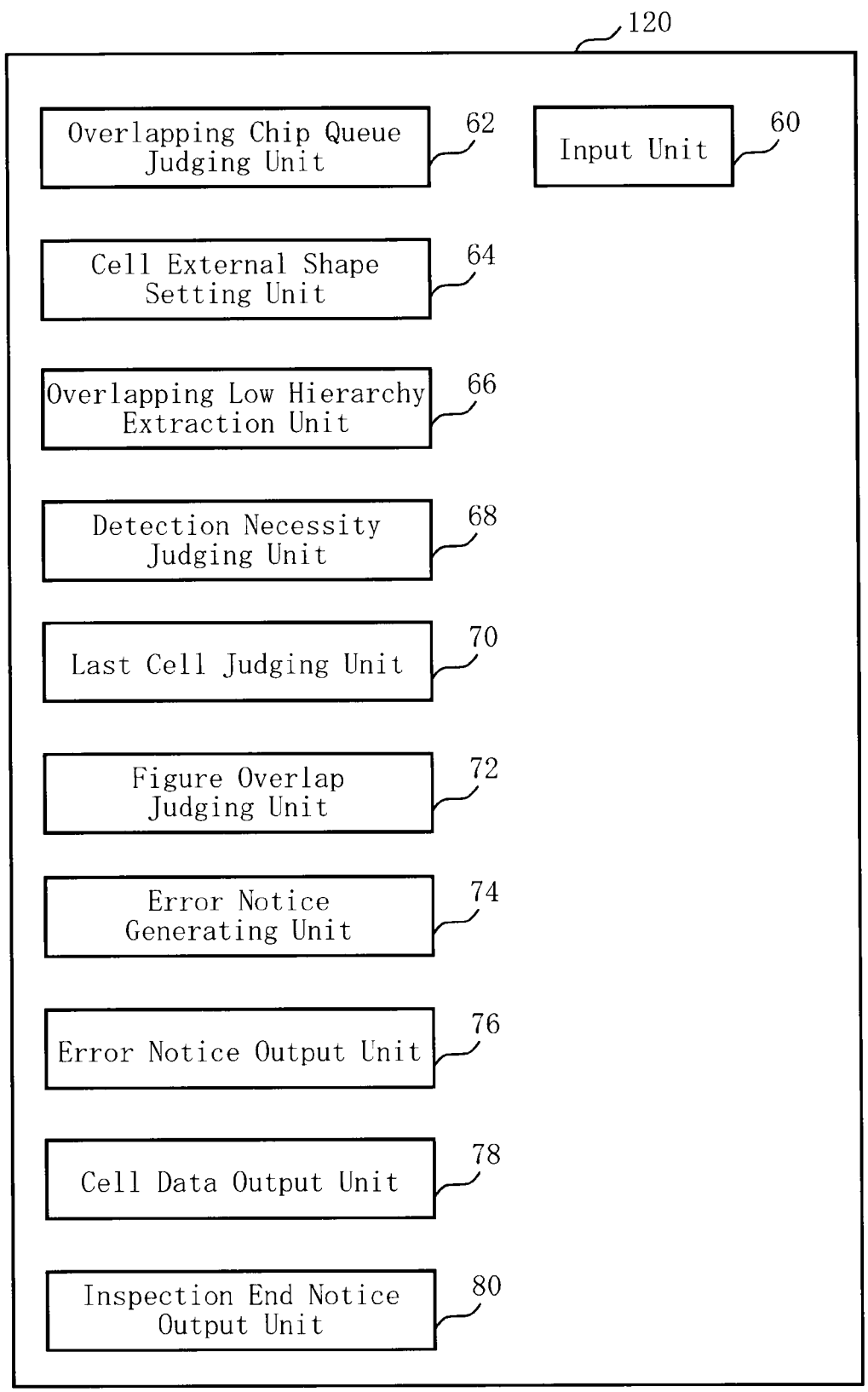
FIG. 11 is a schematic diagram showing the internal structure of a figure overlap inspection unit according to Embodiment 1.

In step S130, the control circuit 112 outputs a request for inspecting a figure overlap, to the figure overlap inspection unit 120. In response to the request for inspecting a figure overlap from the control circuit 112, the figure overlap inspection unit 120 performs an inspection on an overlap between figures as follows:

FIG. 11 is a schematic diagram showing the internal structure of a figure overlap inspection unit according to Embodiment 1. In FIG. 11, the figure overlap inspection unit 120 includes an input unit 60, an overlapping chip queue judging unit 62, a cell external shape setting unit 64, an overlapping low hierarchy extraction unit 66, a detection necessity judging unit 68, a last cell judging unit 70, a figure overlap judging unit 72, an error notice generating unit 74, an error notice output unit 76, a cell data output unit 78, and an inspection end notice output unit 80. Each structure in the figure overlap inspection unit 120 may be configured by hardware such as electric circuits. It is not limited thereto, and each structure may be implemented by software. That is, the figure overlap inspection unit 120 may be a computer. Then, processing of each function, such as the input unit 60, the overlapping chip queue judging unit 62, the cell external shape setting unit 64, the overlapping low hierarchy extraction unit 66, the detection necessity judging unit 68, the last cell judging unit 70, the figure overlap judging unit 72, the error notice generating unit 74, the error notice output unit 76, the cell data output unit 78, and the inspection end notice output unit 80 may be implemented by the figure overlap inspection unit 120 being an example of a computer. Alternatively, they may be executed by a combination of hardware and software, or a combination of hardware, firmware and/or software, etc. When implementing by software or a combination of software and hardware etc., data to be input into the figure overlap inspection unit 120 or each data being or having been processed is stored in the memory 118 or a memory (not shown) each time.

Figure 12:
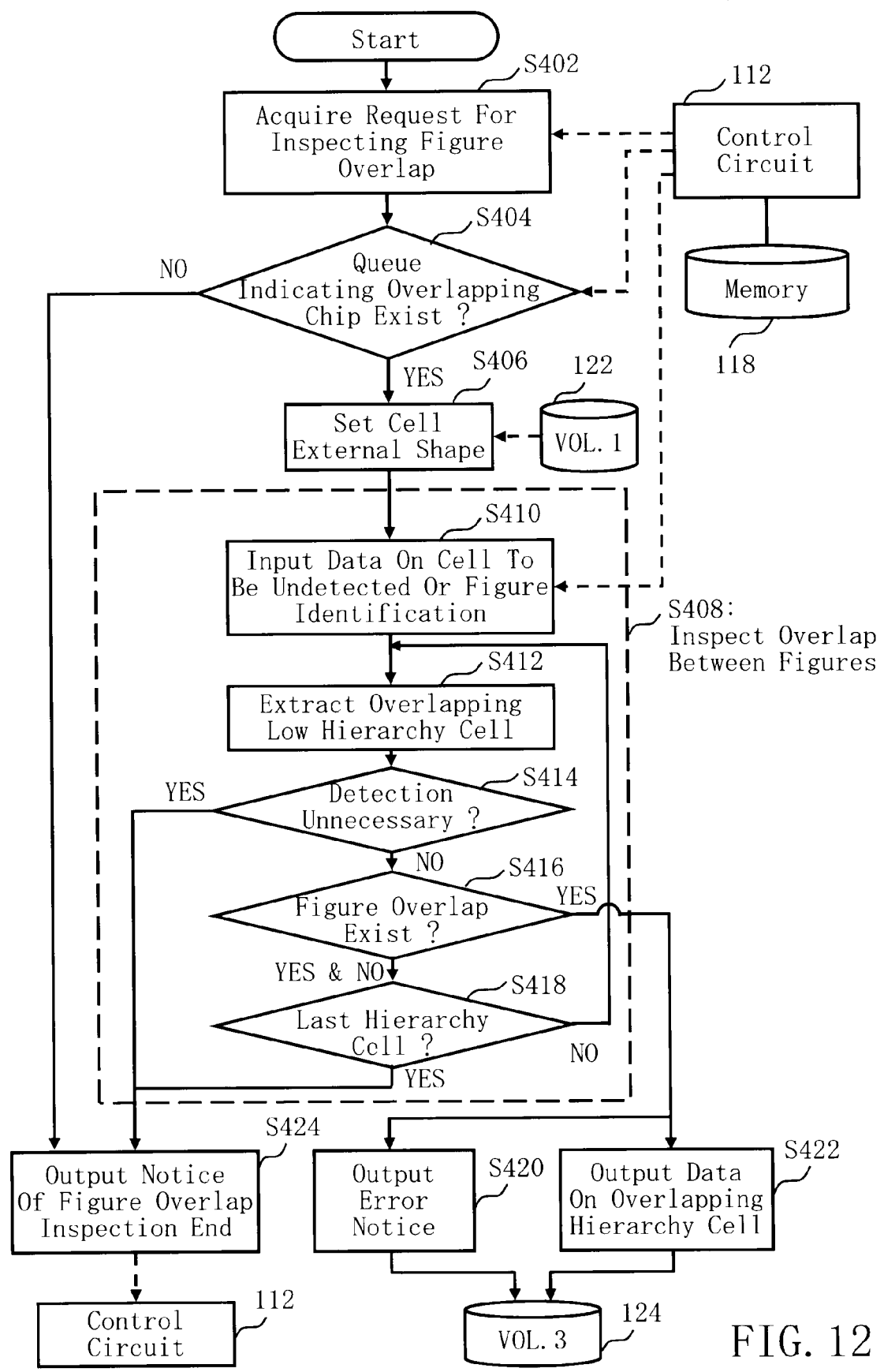
FIG. 12 is a flowchart showing main steps of the method for inspecting an overlap between figures according to Embodiment 1.

FIG. 12 is a flowchart showing main steps of the method for inspecting an overlap between figures according to Embodiment 1. In step S402, the input unit 60 inputs the request for inspecting a figure overlap from the control circuit 112. That is, the figure overlap inspection unit 120 acquires the request for inspecting a figure overlap from the control circuit 112.

In step S404, the overlapping chip queue judging unit 62 refers to registered overlapping chip queues stored in the memory 118 through the control circuit 112, and judges whether the overlapping chip queue concerned is registered or not. If the overlapping chip queue registered exists, it goes to S406. If the overlapping chip queue registered does not exist, it goes to S424.

In step S406, the cell external shape setting unit 64 reads a plurality of overlapping chip data stored in the magnetic disk drive 122, and sets, with respect to each chip region of the overlapping chip data, a plurality of hierarchies and a plurality of cell regions for each of the plurality of hierarchies in such a manner that regions may be smaller in order according to the hierarchy.

Figure 13:
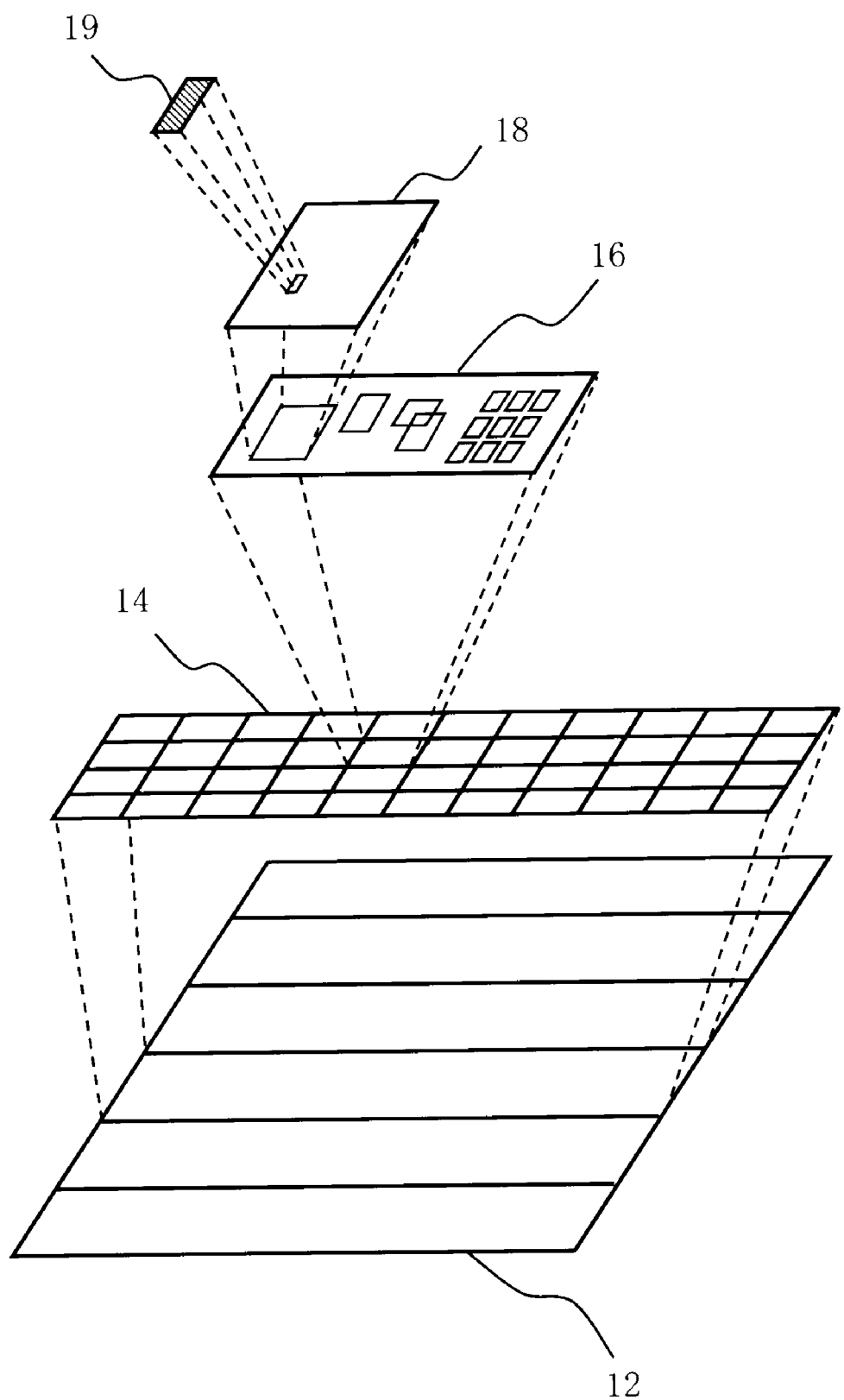
FIG. 13 shows an example of a hierarchical structure of chip data according to Embodiment 1.

FIG. 13 shows an example of a hierarchical structure of chip data according to Embodiment 1. In the chip data, a writing region may have a hierarchical structure composed of a series of plural hierarchical units, such as a hierarchy of a chip 12 of the highest hierarchy (first hierarchy), a hierarchy of a cell 14 of the second hierarchy formed by virtually dividing the chip region into a plurality of strip-like portions in a certain direction, e.g., y-axis direction, a hierarchy of a cell 16 of the third hierarchy formed by dividing the cell 14, a hierarchy of a cell 18 of the fourth hierarchy composed of at least one or more figures in the cell 16, and a hierarchy of a FIG. 19 which constitutes the cell 18. While the cell 14 is herein formed by dividing the chip region into a plurality of strip-like portions arrayed in the y-axis direction (predetermined direction) as an example, it may be divided into portions parallel to the writing surface and arrayed in the direction of x-axis orthogonal to y-axis. Alternatively, it may be other direction parallel to the writing surface. As long as the hierarchical structure as shown in FIG. 13 is set beforehand, and the coordinates and size of a cell of each hierarchy of the chip data are defined as chip data, setting of the coordinates and size of the cell of each hierarchy in the hierarchical structure may be used as they are without modification.

However, there may also exist chip data in which the hierarchical structure, the coordinates and size of a cell in each hierarchy as shown in FIG. 13 are not set beforehand. In such a case, the cell external shape setting unit 64 sets a plurality of hierarchies and a plurality of cell regions for each of the plurality of hierarchies as follows: In addition, there may also exist chip data in which although the hierarchical structure and the coordinates of each cell in each hierarchy are defined, the size of each cell is not defined. Alternatively, there may the case where although the size of each cell is also defined, it is desired to change the size. In these cases, the cell external shape setting unit 64 sets a plurality of cell regions for each of the plurality of hierarchies as follows: The setting is performed from the cell of the lowest hierarchy to the hierarchy of the chip of the highest one in order.

Figure 14:
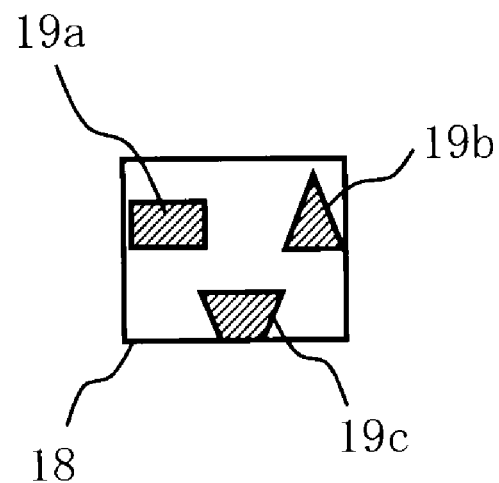
FIG. 14 shows an example of a method of setting a cell of the lowest hierarchy according to Embodiment 1.
Figure 19:
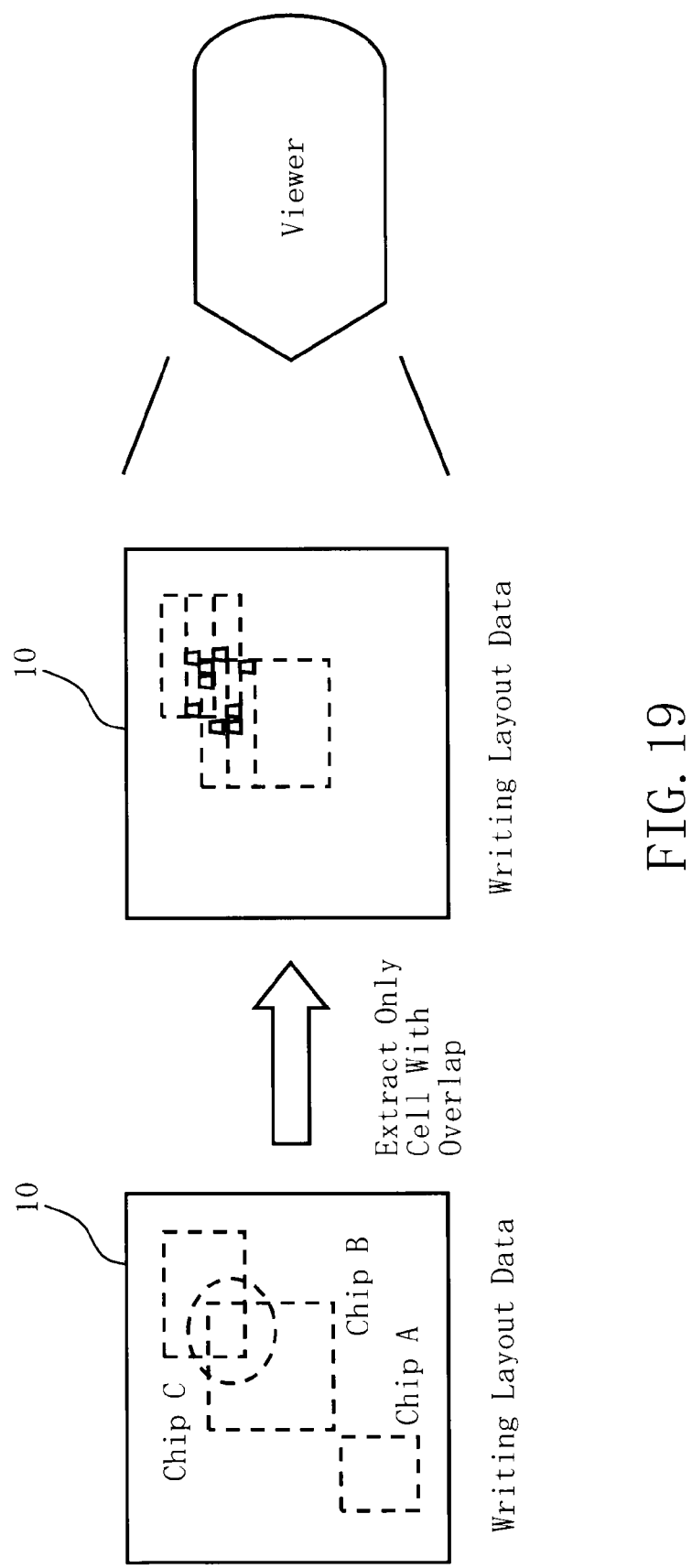
FIG. 19 is a schematic diagram for describing how a user recognizes overlapped figures according to Embodiment 1.

FIG. 14 shows an example of a method of setting a cell of the lowest hierarchy according to Embodiment 1. In FIG. 14, the rectangular cell 18 is set so that three FIGS. 19a to 19c may be surrounded by it, for example. When surrounding the FIG. 19 by the rectangle, it is set so that at least one of the figures may contact the side of the cell 18. In other words, a circumscribed rectangle of some FIG. 19 is set. The number of figures surrounded may change depending upon the cell. For example, the upper limit size of the cell of the lowest hierarchy may be set. When the FIG. 19 surrounded by the size exists, the cell 18 of the lowest hierarchy is set.

Figure 15:
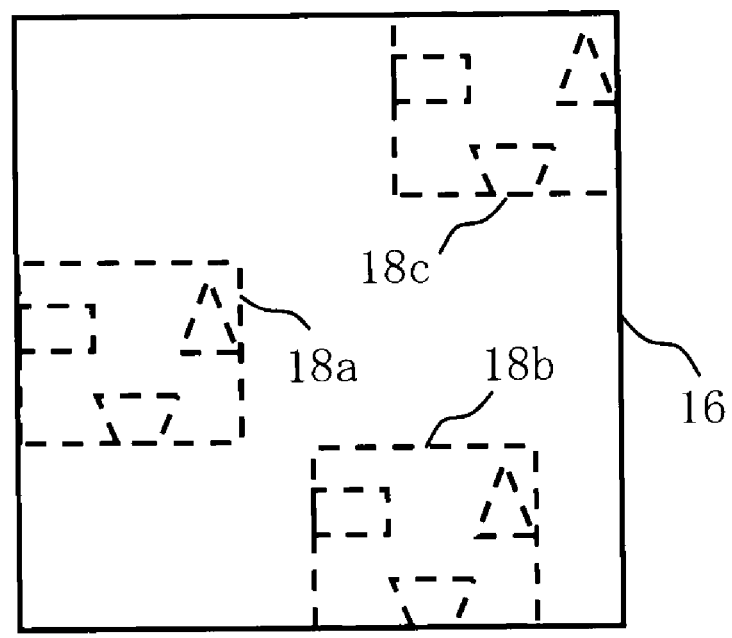
FIG. 15 shows an example of a method of setting a cell of a hierarchy level higher than the cell of the lowest hierarchy according to Embodiment 1.

FIG. 15 shows an example of a method of setting a cell of a hierarchy level higher than the cell of the lowest hierarchy according to Embodiment 1. In FIG. 15, the rectangular cell 16 of one level higher hierarchy is set so that three cells 18a to 18c may be surrounded by it, for example. In this case, when surrounding the cells 18 by a rectangle, it is set so that one side of the lower level cell 18 may contact one side of the cell 16. In other words, a circumscribed rectangle of some cells 18 is set. The number of the cells 18 surrounded may change depending upon the higher level cell 16. For example, the upper limit size of the cell of one level higher hierarchy may be set. When the cell 18 surrounded by the size exists, the cell 16 of one level higher hierarchy is set.

As mentioned above, in the case of data in which the hierarchy and the cell region for each hierarchy are not defined (set) beforehand, a plurality of hierarchies and a plurality of cell regions for each hierarchy are set. To achieve this, the chip region needs to be virtually divided into a plurality of hierarchies and a plurality of cell regions for each hierarchy. In such a case, it is preferable to virtually perform dividing so that the region to surround may be the cell region of the hierarchy just above in order to contact at least one of a plurality of figures Moreover, it is also preferable to virtually perform dividing so that the region to surround may be the cell region of the hierarchy just above a predetermined hierarchy in order to contact at least one of a plurality of cell regions of the predetermined hierarchy.

Figure 16:
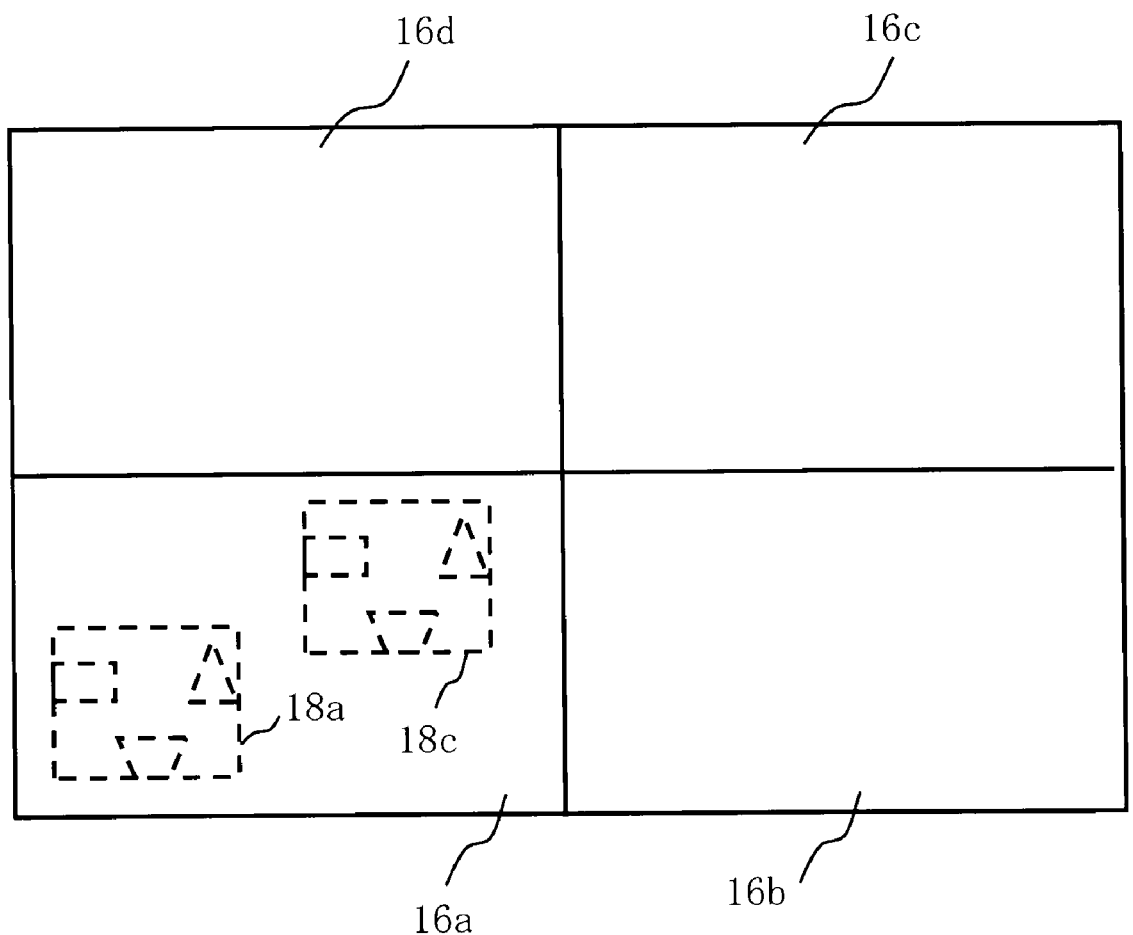
FIG. 16 shows an example in the case of cells of a part of hierarchies being defined according to Embodiment 1.

FIG. 16 shows an example in the case of cells of a part of hierarchies being defined according to Embodiment 1. In FIG. 16, when the hierarchy region has been divided beforehand into grid-like portions, the frame of the grid-like portion surrounding the cells 18*a* and 18*c* of the lowest hierarchy may be set as the cell 16 of one level higher hierarchy.

As mentioned above, the cell external shape setting unit 64 sets, with respect to each chip region of the overlapping chip data, a plurality of hierarchies and a plurality of cell regions for each of the plurality of hierarchies in such a manner that regions may be smaller in order according to the hierarchy. Owing to this, the coordinates and size of each cell are calculated. The cell data of each cell is stored in the memory 118 or a memory (not shown).

In step S408 of FIG. 12, inspection on an overlap of figures is performed by the figure overlap inspection unit 120. The step S408 of inspecting a figure overlap includes, as internal steps, a step of inputting data on a cell to be undetected or figure identification data (S410), a step of extracting an overlapping low hierarchy cell (S412), a step of judging necessity of detection (S414), a step of judging a figure overlap (S416), and a step of judging last hierarchy cell (S418). They will be explained as follows:

In step S410, the input unit 60 inputs the data on a cell to be undetected or figure identification data stored in the memory 118 through the control circuit 112.

In step S412, with respect to a plurality of chip regions where the overlap occurs, cell regions at the position of the overlapping are extracted by the overlapping low hierarchy extraction unit 66 from a cell region of a higher hierarchy level to a cell region of lower hierarchy level in order.

Figure 17:
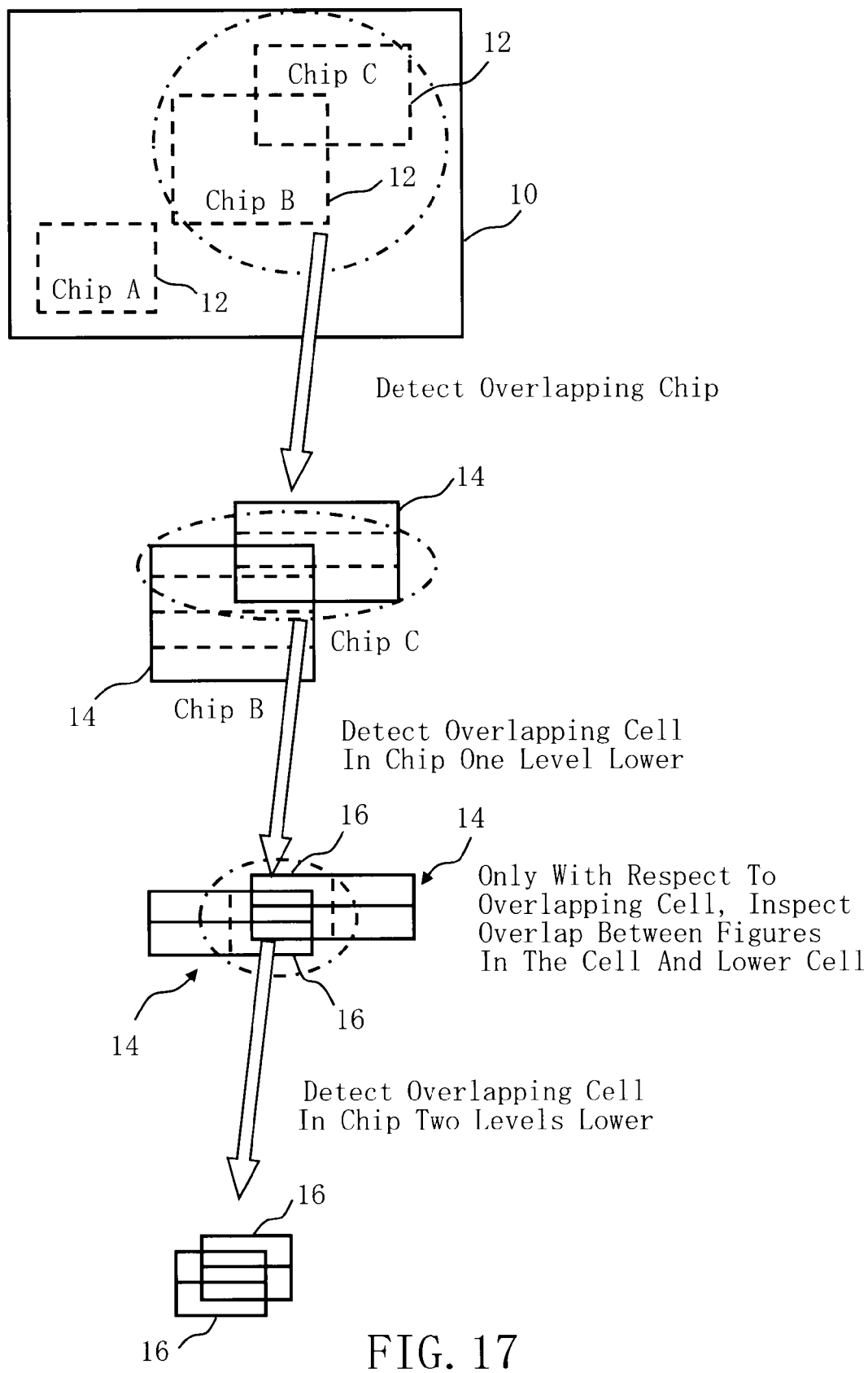
FIG. 17 is a schematic diagram for describing a method of extracting overlapping cells according to Embodiment 1.

FIG. 17 is a schematic diagram for describing a method of extracting overlapping cells according to Embodiment 1. First, the overlapping low hierarchy extraction unit 66 reads overlapping chip data, which is stored in the magnetic disk drive 122, into a writing layout region 10, and arranges the hierarchy of the chip 12 of the overlapping chip data. Since one overlapping side needs the other overlapping side, generally, a plurality of hierarchies of the chip 12 of overlapping chip data are arranged. FIG. 17 shows the state where Chip B and Chip C are overlapped with each other. Therefore, first, Chip B and Chip C are extracted as overlapped chips. Then, if the margin used in the simplified overlap inspection has been added, the existence of an overlap can be judged while adding a margin like the case of the simplified overlap inspection.

Next, cells 14 overlapped each other in the hierarchy one level lower than the hierarchy of the chip 12 in the overlapping chips are extracted. FIG. 17 shows the state where a part of the cell 14 of Chip B and a part of the cell 14 of chip C are extracted.

In step S414 of FIG. 12, the detection necessity judging unit 68 judges whether the extracted part of the cell 14 of Chip B and the extracted part of the cell 14 of chip C are cells to be undetected or not, based on the data on a cell to be undetected or the figure identification data. If they are cells to be undetected, it goes to S424. If they are not cells to be undetected, it goes to S416.

In step S416, the figure overlap judging unit 72 judges the existence of an overlap between the figure in one cell region extracted and the figure in the other cell region extracted. If there is an overlap between the figures, it goes to S420 and S422. Moreover, whether or not there is an existence of an overlap between figures, it goes to the next S418 after finishing.

In step S418, the last cell judging unit 70 judges whether the extracted part of the cell 14 of Chip B and the extracted part of the cell 14 of Chip C are cells of the last hierarchy or not. If they are cells of the last hierarchy, it goes to S424. If they are not cells of the last hierarchy, it returns to S412.

When it returns to S412, then, the two overlapping cells 14 are extracted, and further the overlapping cells 16 which are overlapped with each other at the hierarchy one level lower than that of the cells 14 are also extracted. Then, the detection necessity judging step (S414), the figure overlap judging step (S416), and the last hierarchy cell judging step (S418) are performed. When they are not cells of the last hierarchy, it returns to S412 again. Thus, as long as they are not cells to be undetected, the overlapping low hierarchy cell extraction step (S412), the detection necessity judging step (S414), the figure overlap judging step (S416), and the last hierarchy cell judging step (S418) are repeated to the lowest hierarchy. In this way, while extracting overlapping cells of a low hierarchy, down to the lowest hierarchy, judging a figure overlap is executed.

Figure 18:
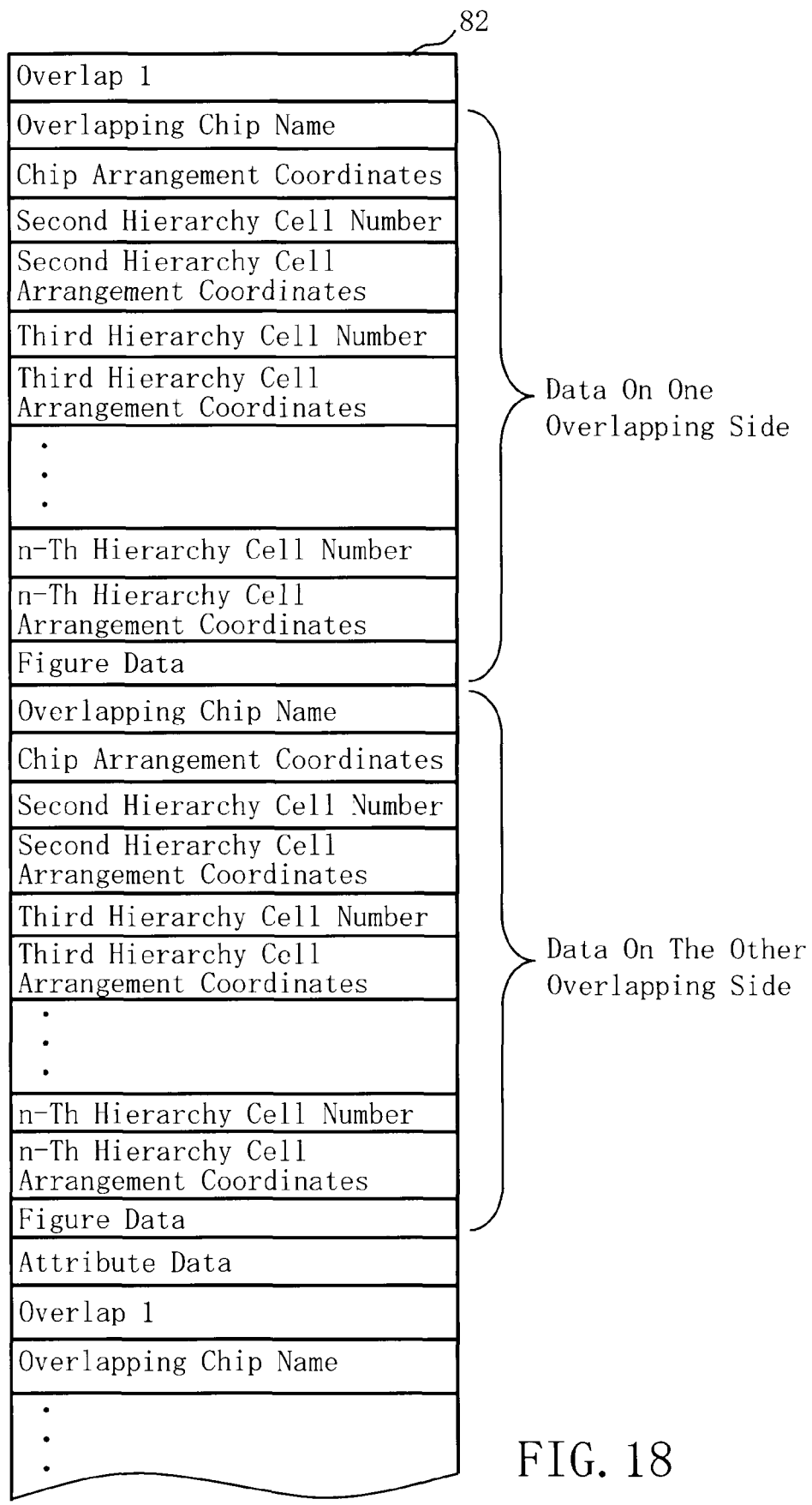
FIG. 18 shows an example of an error notice file according to Embodiment 1.

In step S420, the error notice generating unit 74 generates an error notice concerning the overlapping figures. FIG. 18 shows an example of an error notice file according to Embodiment 1. In an error notice file 82 of FIG. 18, an overlap number, data on an overlapping one, data on the other overlapping one, and attribute data are defined repeatedly, namely the number of times of overlapping. In the error notice file 82, "Overlap 1" is first defined as an overlap number. Then, as data on an overlapping one, an overlapping chip name, chip arrangement coordinates, the second hierarchy cell number, the second hierarchy cell arrangement coordinates, the third hierarchy cell number, the third hierarchy cell arrangement coordinates, . . . , the n-th hierarchy cell number, the n-th hierarchy cell arrangement coordinates, and the figure data of the lowest hierarchy are defined in the error notice file 82. Next, as data on the other overlapping one, an overlapping chip name, chip arrangement coordinates, the second hierarchy cell number, the second hierarchy cell arrangement coordinates, the third hierarchy cell number, the third hierarchy cell arrangement coordinates, . . . , the n-th hierarchy cell number, the n-th hierarchy cell arrangement coordinates, and the figure data of the lowest hierarchy are defined. Then, as attribute data, an overlap situation is described, for example. Next, "Overlap 2" is defined as an overlap number. Similarly, data on an overlapping one, data on the other overlapping one, and attribute data are defined. Since the steps from the overlapping low hierarchy cell extraction step (S412) to the last hierarchy cell judging step (S418) are repeated down to the lowest hierarchy, if there is an overlap between figures, the data mentioned above will be accumulated each time.

The error notice output unit 76 outputs the error notice file 82, as data on a plurality of overlapping figures, to the magnetic disk drive 124. Then, the error notice file 82 is stored in the magnetic disk drive 124.

In step S422, the cell data output unit 78 outputs cell data of overlapping hierarchy cell, as data on a plurality of overlapping figures, to the magnetic disk drive 124. Since the cell data of overlapping hierarchy cell has been set in the cell external shape setting step (S406), such data can be read from the memory 118. As the cell data of the lowest hierarchy, data on the internal FIG. 19 may be defined.

In step S424, when cells are the ones to be undetected, or when the inspection on a figure overlap has been completed down to the cell of the last hierarchy, the inspection end notice output unit 80 outputs an inspection end notice to the control circuit 112.

In step S132 of FIG. 3, the control circuit 112 acquires the inspection end notice from the inspection end notice output unit 80.

In step S134, the control circuit 112 deletes an overlapping chip queue registered in the memory 118, with respect to a chip the inspection on which has been completed.

FIG. 19 is a schematic diagram for describing how a user recognizes overlapped figures according to Embodiment 1. The control circuit 112 displays, using the display tool 132, the error notice file 82 and overlapping hierarchy cells which are stored in the magnetic disk drive 124, on the monitor 134. In FIG. 19 shows the situation of the overlapping cells of the lowest hierarchy and overlapping figures inside of them. As mentioned above, while grasping the hierarchy and cell region of each chip, the user can detect overlapping figures. Therefore, it is possible, before merging a plurality of chips, to easily detect that in which hierarchical region of which chip the overlapping figure was allocated. As a result, writing data can be corrected in a short time, and recovery time of the pattern writing apparatus is greatly reduced.

Meanwhile, data conversion is also performed in parallel to the inspection on a figure overlap mentioned above. In step S140 of FIG. 3, the control circuit 112 outputs a data conversion processing request to the data processing circuit group 126. In response to the data conversion processing request, the data processing circuit group 126 reads, one by one, chip data stored in the magnetic disk drive 122, and distributes it to one of the data processing circuits 128 by the control circuit 112. Then, the data processing circuit 128 concerned reads overlapping chip data from the magnetic disk drive 122, and after conversion in several steps, converts it to shot data of the format of the pattern writing apparatus 100. The shot data is output to the magnetic disk drive 130. After the data conversion processing, the data processing circuit 128 concerned outputs a data conversion end notice to the control circuit 112.

In step S142, the control circuit 112 acquires the data conversion end notice from the data processing circuit 128.

As mentioned above, the inspection on a figure overlap and the data conversion of the overlapping chip data are performed in parallel. In addition, data on chips without overlap is stored in the magnetic disk drive 109. Therefore, after transferring the overlapping chip data, transmission of non-overlapping chip data will be performed.

In step S122, the control circuit 112 outputs a request for transferring non-overlapping chip data to the transfer processing circuit 116. In response to the request for transferring non-overlapping chip data from the control circuit 112, the transfer processing circuit 116 performs data transfer as follows:

In step S308 of FIG. 10, the transfer processing circuit 116 acquires the request for transferring non-overlapping chip data from the control circuit 112.

In step S310, the transfer processing circuit 116 selects the chip data file on a chip corresponding to the non-overlapping chip from the magnetic disk drive 109, and transfers it to the magnetic disk drive 122.

In step S312, each time when the transfer of the chip data file on each chip corresponding to the non-overlapping chip is completed, the transfer processing circuit 116 outputs data indicating that non-overlapping chip data has been transferred, to the control circuit 112.

As mentioned above, the chip data file on each chip corresponding to the remaining non-overlapping chip will be transferred. This transfer processing is performed in parallel to the inspection on a figure overlap and the data conversion processing of the overlapping chip data as shown in FIG. 2. That is, transmission of non-overlapping chip data is performed during the processing of overlapping chip data, thereby shortening the data processing time.

In step S124 of FIG. 3, the control circuit 112 acquires the data indicating that non-overlapping chip data has been transferred from the transfer processing circuit 116.

In step S126, the control circuit 112 registers a transfer completion queue indicating a transfer completion concerning the non-overlapping chip. The transfer completion queue is stored in the memory 118.

After the completion of transferring non-overlapping chip data, data conversion processing is performed like the case of overlapping chip data. In step S140, the control circuit 112 outputs a data conversion processing request to the data processing circuit group 126. In response to the data conversion request, the data processing circuit group 126 reads, one by one, chip data on the non-overlapping chip stored in the magnetic disk drive 122, and distributes it to one of the data processing circuits 128 by the control circuit 112. Then, the data processing circuit 128 concerned reads non-overlapping chip data from the magnetic disk drive 122, and after conversion in several steps, converts it to shot data of the format of the pattern writing apparatus 100. The shot data is output to the magnetic disk drive 130. After the data conversion processing, the data processing circuit 128 concerned outputs a data conversion end notice to the control circuit 112.

In step S142, the control circuit 112 acquires the data conversion end notice from the data processing circuit 128.

As mentioned above, data conversion processing of the non-overlapping chip data is performed.

In the above description, when there is an overlap in the figure hierarchy, the overlap is corrected first, and then again each step mentioned above is executed. After correcting the overlap in the figure hierarchy, all the chip data is converted into shot data, to be stored in the magnetic disk drive 130. The shot data is output to the writing control circuit 140, and the writing unit 150 writes a writing pattern, constituted by a plurality of arranged chips having no overlap in the figure hierarchy, onto the target workpiece 101 by using the electron beam 200. The writing unit 150 is controlled by the writing control circuit 140.

The electron beam 200, being an example of a charged particle beam, emitted from the electron gun assembly 201 irradiates the entire first aperture 203 having an opening in the shape of a rectangle by the illumination lens 202. At this point, the electron beam 200 is shaped to be a rectangle. Such a rectangular shape may be a square, rhombus, rhomboid, etc. Then, after having passed through the opening of the first aperture 203, the electron beam 200 of a first aperture image is projected onto the second aperture 206 by the projection lens 204. The position of the first aperture image on the second aperture 206 is controlled by the deflector 205, so as to change the shape and size of the beam. After having passed through the opening of the second aperture 206, the electron beam 200 of a second aperture image is focused by the objective lens 207 and deflected by the deflector 208, to reach a desired position on the target workpiece 101 placed on the XY stage 105 which is movably arranged.

As mentioned above, according to the present Embodiment, writing data is corrected in a short time and recovery time of the writing apparatus is greatly shortened, thereby reducing the writing time needed for entire writing from the data transmission to the writing completion.

Now, a modification example of inspecting an overlapping figure will be described.

Figure 20A:
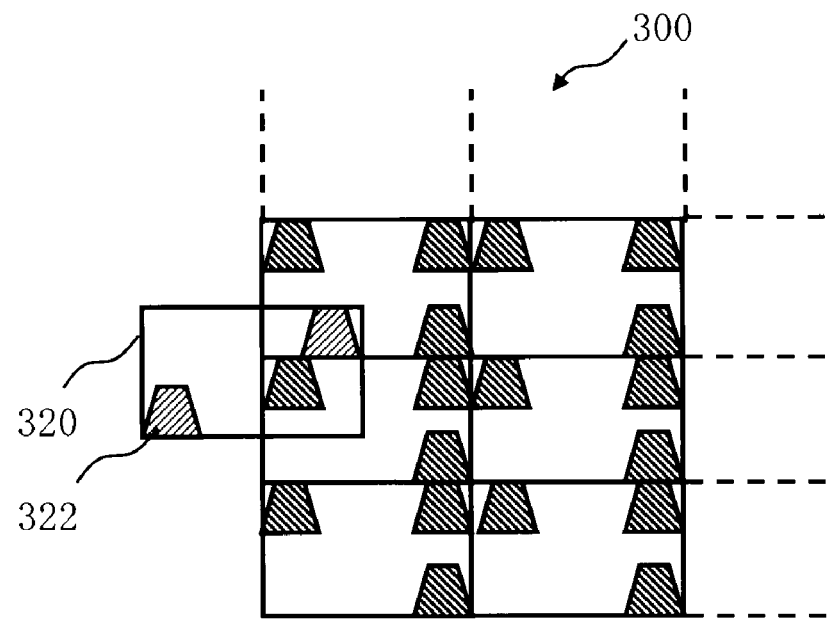
FIGS. 20A and 20B illustrate a method of inspecting an overlap of figures between an array structure cell and a single cell according to Embodiment 1.
Figure 20B:
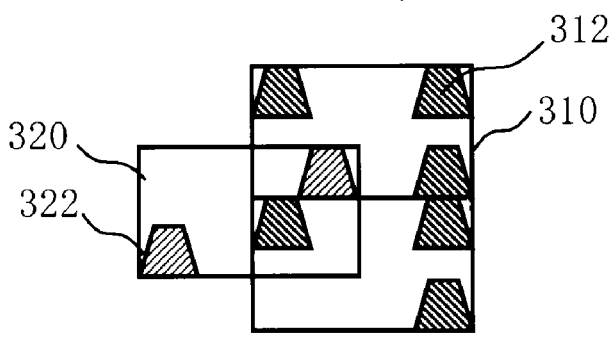

FIGS. 20A and 20B illustrate a method of inspecting an overlap of figures between an array structure cell and a single cell according to Embodiment 1. In FIG. 20A, when repeatedly arranging cells of the same figure array with respect to one chip, it may be defined as an array structure cell 300. In FIG. 20A, the other chip is defined as a single cell 320. When judging the existence of a figure overlap with respect to both the cells mentioned above, it is not necessary to target the whole of the array structure cell 300. Therefore, as shown in FIG. 20B, only an overlapping cell 310 in a plurality of cells constituting the entire array structure cell 300 needs to be extracted. Then, the existence of an overlap is judged with respect to a FIG. 322 in the cell 320 and a FIG. 312 in the two cells 310. Thus, the number of cells to be judged is decreased, thereby judging is performed in a short time.

Figure 21A:
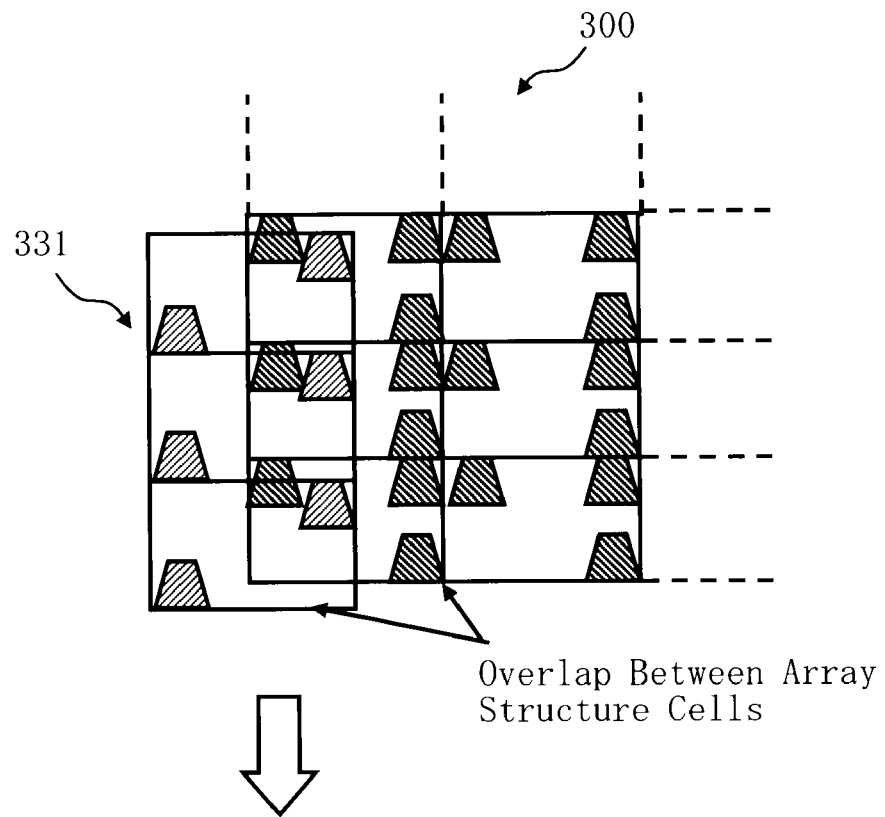
FIGS. 21A and 21B illustrate a method of inspecting an overlap of figures between array structure cells according to Embodiment 1.
Figure 21B:
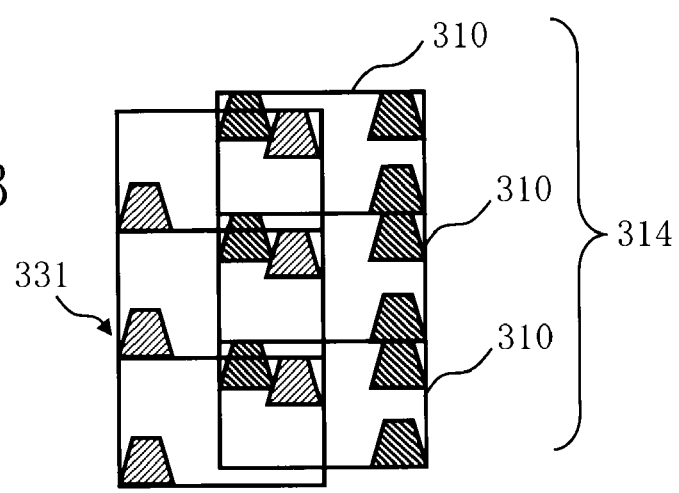

FIGS. 21A and 21B illustrate a method of inspecting an overlap of figures between array structure cells according to Embodiment 1. In FIG. 21A, when repeatedly arranging cells of the same figure array with respect to one chip, it may be defined as the array structure cell 300. In FIG. 21A, the other chip is also defined as repeatedly arranging cells of the same figure array, to be an array structure cell 331. When judging the existence of a figure overlap with respect to both the cells mentioned above, it is not necessary to target the whole of the array structure cell 300 and the whole of the array structure cell 331. Therefore, as shown in FIG. 21B, only an overlapping cell 310 in a plurality of cells constituting the entire array structure cell 300 needs to be extracted with respect to one chip. Similarly, only an overlapping cell in a plurality of cells constituting the entire array structure cell 331 needs to be extracted with respect to the other chip. FIG. 21B shows the situation where all the cells are extracted since all the cells constituting the entire array structure cell 331 are overlapping. Then, the existence of an overlap is judged between each figure in the three cells of the array structure cell 331 and each figure in a cell group 314 composed of the three cells 310. Thus, the number of cells to be judged is decreased, thereby judging is performed in a short time.

As mentioned above, it is preferable for the array structure cell to extract only the overlapping portion. Now, inspecting a figure overlap between single cells may be performed as follows:

FIGS. 22A and 22B show an example of inspecting an overlap between a cell and a figure according to Embodiment 1. When extraction has been performed down to the last cells 341 and 344 as shown in FIG. 22A, according to the example described above, it goes to the step of judging the existence of an overlapping figure. However, as shown in FIG. 22B, it is also preferable that a figure is developed only with respect to one cell 344, the existence of an overlap is judged between a figure 346 arranged in the cell 344 and the cell 341, and similarly, the existence of an overlap is judged between a figure 348 and the cell 341. For example, it is suitable to develop a cell having few figures. Then, if no overlap occurs at this point, the inspection ends.

FIGS. 23A and 23B show an example of inspecting an overlap between a cell and another cell of a higher hierarchy level according to Embodiment 1. In the example mentioned above, chips of the same number of hierarchy levels are inspected. However, there may be a case of an overlap between chips of different number of hierarchy levels. That is, as shown in FIG. 23A, there may a case where although development has been performed down to the last cell 341 with respect to one chip, another development has been performed only down to the cell 344 of a hierarchy level higher than the last cells 350 and 352 with respect to the other chip. In such a case, as shown in FIG. 23B, development is performed down to cells 350 and 352 arranged in the cell 342 with respect to only one cell 342. Then, it is also preferable to judge the existence of an overlap between the cell 350 and the cell 341, and between the cell 352 and the cell 341. For example, it is suitable to develop a cell having a smaller total number of figures and arranged cells. Then, if no overlap occurs at this point, the inspection ends.

FIGS. 24A and 24B show another example of inspecting an overlap between a cell and another cell of a higher hierarchy level according to Embodiment 1. As shown in FIG. 24A, there may be a case where although development has been performed down to the last cell 341 with respect to one chip, another development has been performed down to a cell 345 of a higher hierarchy level including the figure 346 and the cell 350 with respect to the other chip. Thus, for example, there may be a case where the single figure 346 remains without constituting a cell, and the figure 346 and the cell 350 together constitute a cell of one level higher. In such a case, as shown in FIG. 24B, development is performed down to the cell 350 and the figure 346 arranged in the cell 345 with respect to one cell 345. Then, it is also preferable to judge the existence of an overlap between the cell 350 and the cell 341, and between the figure 346 and the cell 341. For example, it is suitable to develop a cell having a smaller total number of figures and arranged cells. Then, if no overlap occurs at this point, the inspection ends.

FIGS. 25A and 25B show another example of inspecting an overlap between a cell and another cell of a higher hierarchy level according to Embodiment 1. As shown in FIG. 25A, there may be a case where although development has been performed down to the last cell 341 with respect to one chip, another development has been performed down to a cell 354 of a higher hierarchy level including figures 358 and 360 and a cell 356 with respect to the other chip. Thus, for example, there may be a case where the single figures 358 and 360 remain respectively without constituting a cell because the figures are independently separated, and the figures 358 and 360 and another cell 356 together constitute the cell 354 of one level higher. In such a case, as shown in FIG. 25B, development is performed down to the cell 356 and the figures 358 and 360 arranged in the cell 354 with respect to one cell 354. For example, it is suitable to develop a cell having a smaller area. Then, it is also preferable to judge the existence of an overlap between the cell 356 and the cell 341, between the figure 358 and the cell 341, and between the figure 360 and the cell 341. Then, if no overlap occurs at this point, the inspection ends. In FIG. 25B, since there is an overlap between the figure 360 and the cell 341, the existence of an overlap between the figure 360 and a figure 343 in the cell 341 is further judged. Alternatively, it is also preferable to judge the existence of an overlap between the cell 356 and a plurality of figures 343 in the cell 341, between the figure 358 and the plurality of figures 343 in the cell 341, and between the figure 360 and the plurality of figures 343 in the cell 341.

Figures 26A, 26B:
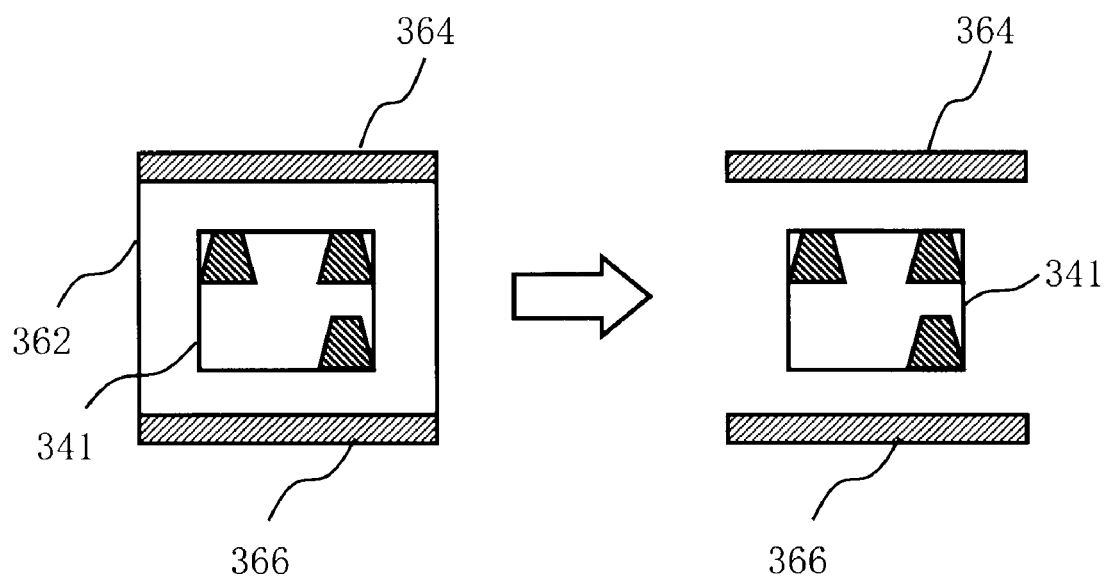
FIGS. 26A and 26B show an example of inspecting an overlap between cells of different sizes according to Embodiment 1.

FIGS. 26A and 26B show an example of inspecting an overlap between cells of different sizes according to Embodiment 1. As shown in FIG. 26A, there may be a case where the size of the last cell 362 of one chip is different from that of the last cell 341 of the other chip. FIG. 26A shows a position relation in which the entire cell 341 is included the cell 362. In such a case, as shown in FIG. 26B, development is performed down to figures 364 and 366 arranged in the cell 362, only with respect to one larger cell 362. Then, it is also preferable to judge the existence of an overlap between the figure 364 and the cell 341, and between the figure 366 and the cell 341. Then, if no overlap occurs at this point, the inspection ends.

Figure 27:
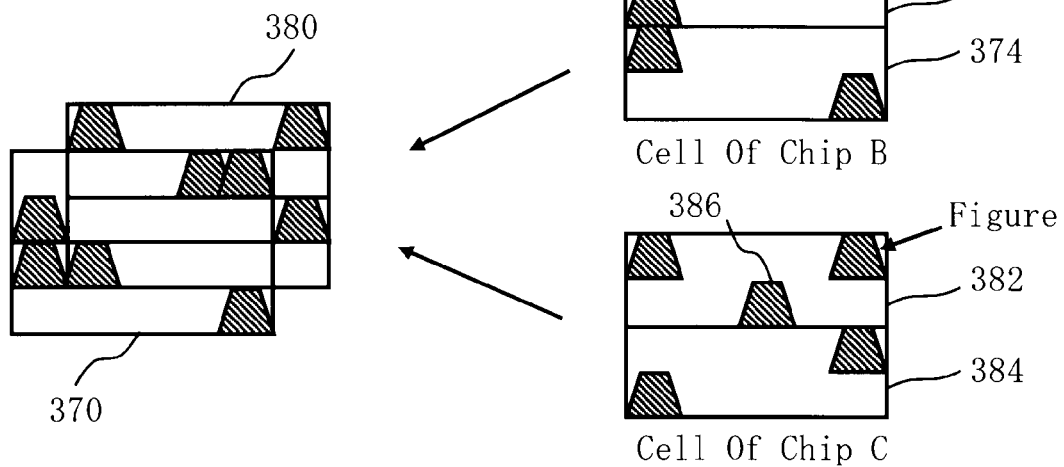
FIG. 27 shows an example of the case where a plurality of cells overlap with each other according to Embodiment 1.

FIG. 27 shows an example of the case where a plurality of cells overlap with each other according to Embodiment 1. In FIG. 27, cells 372 and 374 of Chip B are overlapped with cells 382 and 384 of Chip C.

Figure 28:
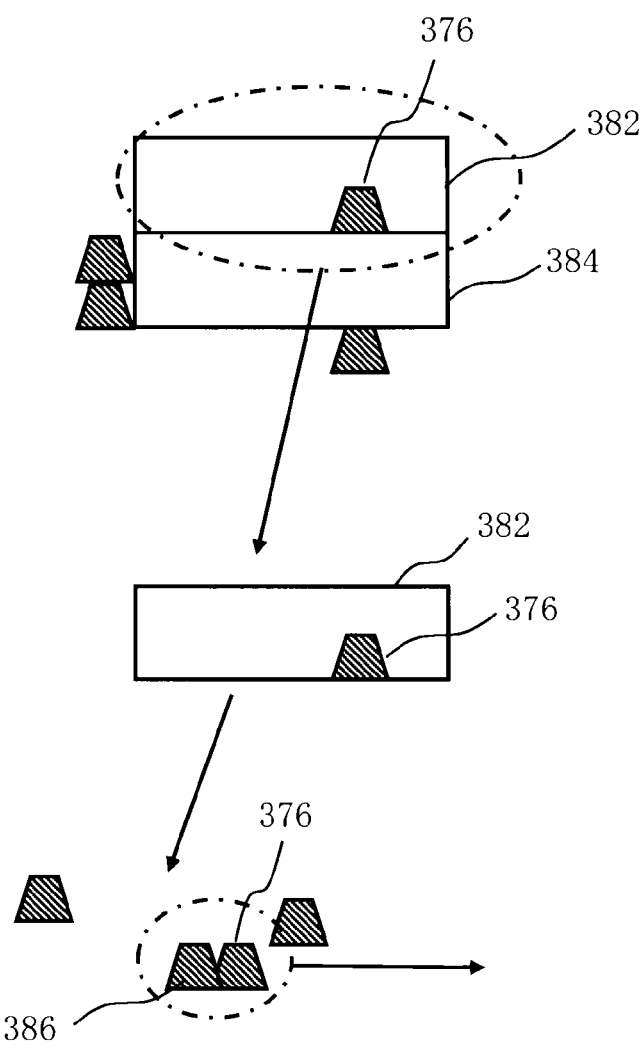
FIG. 28 is a schematic diagram for explaining a method of inspecting a figure overlap in the case of FIG. 27.
Figure 29:
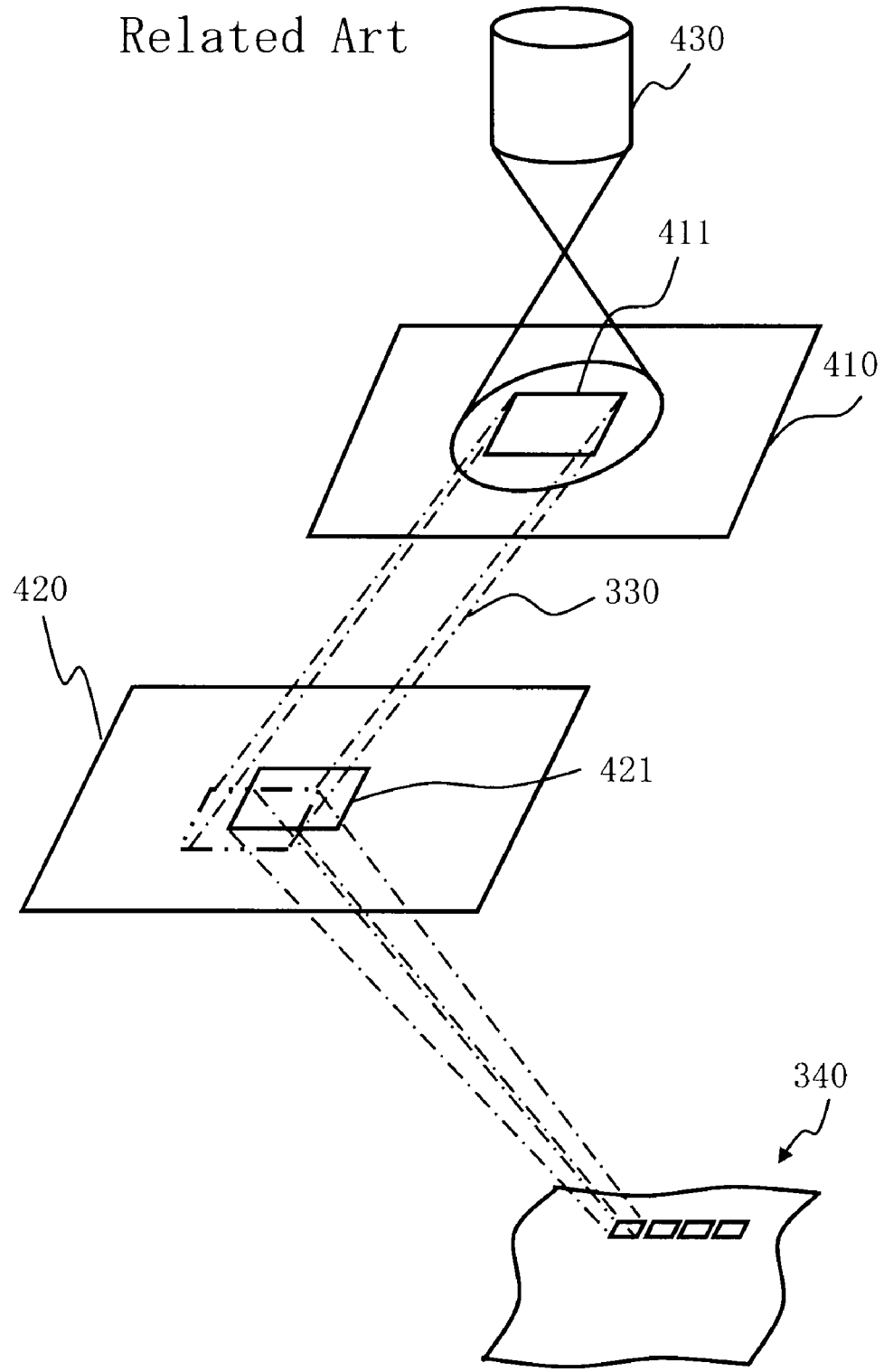
FIG. 29 is a schematic diagram showing operations of a variable-shaped electron beam type writing apparatus.
Figure 30:
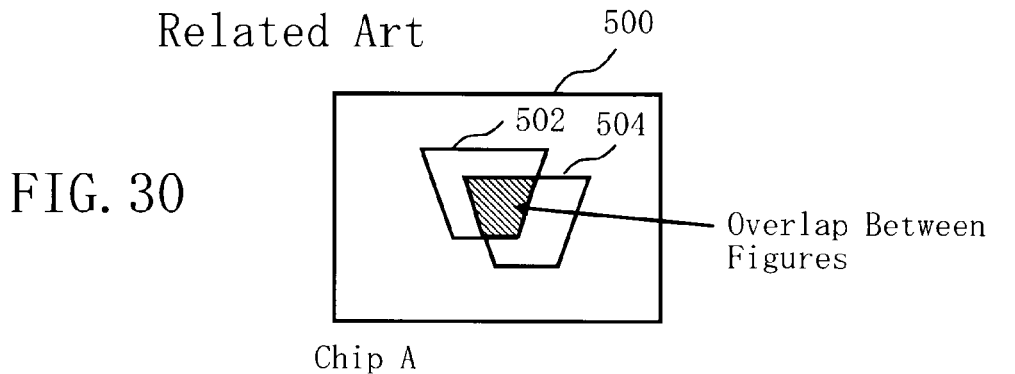
FIG. 30 shows an example of the case of an overlap occurring between the figures in one chip.
Figure 31:
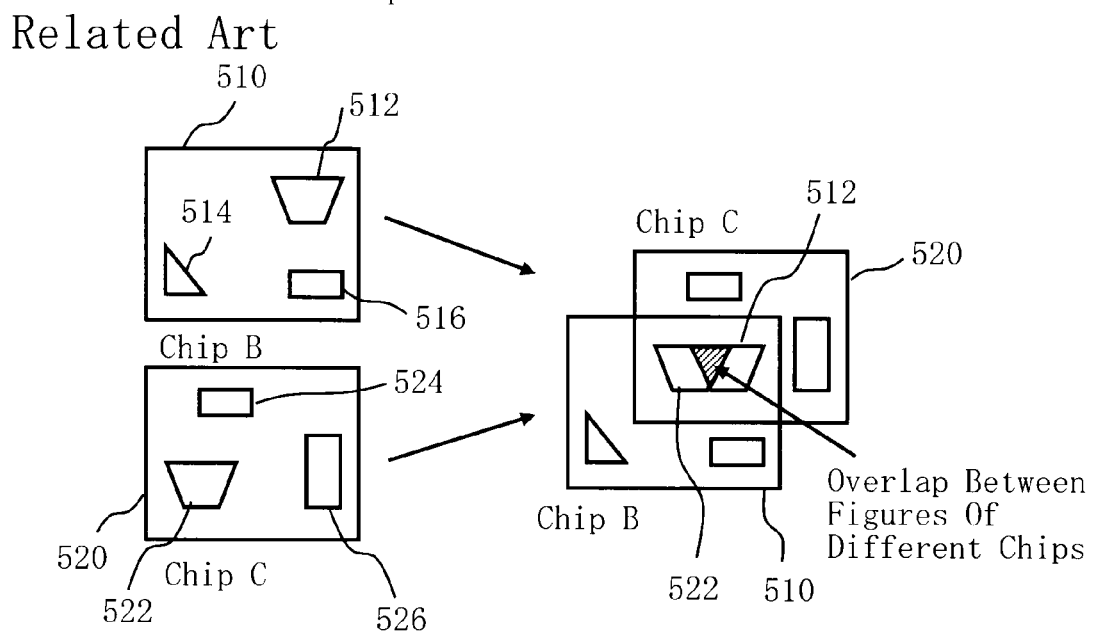
FIG. 31 shows an example of an overlap between figures in different chips.
Figure 32:
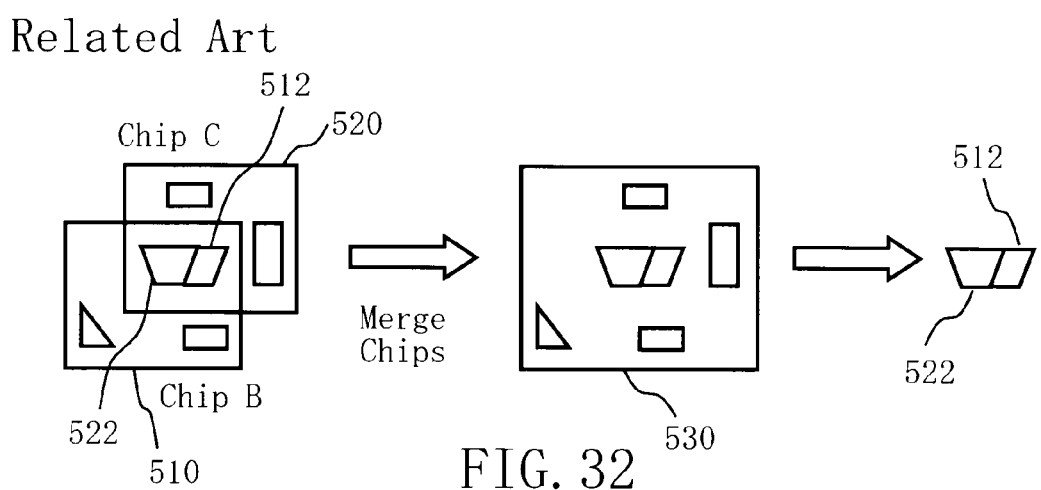
FIG. 32 shows an example of an overlap between figures when merging different chips.

FIG. 28 is a schematic diagram for explaining a method of inspecting a figure overlap in the case of FIG. 27. For example, development is performed only with respect to the cells 372 and 374 of Chip B. Then, the existence of an overlap is judged whether a figure 376 in the cell 372 and other figures in the cells 372 and 374 of Chip B are overlapped with cells 382 and 84 or not. In the case of FIG. 28, since the cell 382 and the figure 376 are overlapped with each other, they are extracted. Then, the existence of an overlap is judged whether a figure 386 in the cell 382 and other internal figures are overlapped with the figure 376 or not. That is, as mentioned above, it is suitable to perform development of cells of one chip first. Thereby, the number of cells or figures to be extracted is reduced. Consequently, an overlap inspection can be performed in a short time.

As mentioned above, according to Embodiment 1, an overlap between a plurality of chip regions themselves is first inspected based on arrangement data of each chip region. At this point, overlapping figures are not identified. Then, cell regions at the position of the overlapping are extracted from a cell region of a higher hierarchy level to a cell region of lower hierarchy level in order. Owing to this, while detecting and grasping the hierarchy and the cell region, it can gradually approach the cell region where the overlapping figures are arranged. Then, what is necessary is to inspect the existence of an overlap between a figure in a cell region extracted and a figure in the other cell region extracted.

Then, as mentioned above, in inspecting an overlap of figures between chips in which the hierarchy and cell regions for each hierarchy are defined beforehand, it is not necessary for the cell external shape setting unit 64 to particularly set a cell region. While detecting and grasping the hierarchy and the cell region, it can gradually approach the cell region where the overlapping figures are arranged.

On the other hand, in inspecting an overlap of figures between chips in which the hierarchy and cell regions for each hierarchy are not defined (set) beforehand, the cell external shape setting unit 64 needs to set a plurality of hierarchies and a plurality of cell regions for each hierarchy as mentioned above.

Moreover, when inspecting an overlap of figures between chips in the data where the sizes of cell regions are not defined although the hierarchy and the coordinates of cell regions for each hierarchy are defined beforehand, what is necessary is that the cell external shape setting unit 64 sets a plurality of cell regions for each hierarchy in each chip data, with respect to a plurality of chip regions.

As mentioned above, according to this Embodiment 1, it is possible to detect overlapping figures while grasping the hierarchy and cell region. Therefore, it is possible to easily find that in which hierarchical region of which chip each of the overlapping figures was allocated. Consequently, writing data can be corrected in a short time, and recovery time of the pattern writing apparatus is greatly reduced.

Functions of what is represented by the word "unit", "circuit" or "step" or functions of each step shown in flowcharts in the description above can be configured by computer programs. They may be implemented by software programs executed by the computer system. Alternatively, they may be executed by a combination of software and hardware, or a combination of software, hardware and/or firmware. When constituted by a program, the program is stored in the magnetic disk drive 122, the memory 118, or a recording medium, such as a magnetic tape drive, FD, CD, DVD, MO, or ROM which are not illustrated.

While the embodiments have been described above with reference to specific examples, the present invention is not limited to these specific ones.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other apparatus and method for inspecting an overlap between figures and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for inspecting overlapping figures comprising:
a chip overlap inspection unit configured to input a data file on each chip of a plurality of chips arranged in a writing pattern, and inspect an existence of an overlap between each region of a plurality of chips, based on arrangement data on each region of the plurality of chips, wherein the plurality of chips are different chips to be written;
a setting unit configured to set, with respect to the plurality of chips, a plurality of hierarchies and a plurality of cell regions of each of the plurality of hierarchies;
an extraction unit configured to extract, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and another cell region extracted is included in the other one of the plurality of chips where the overlap occurs;
a figure overlap judging unit configured to judge an existence of an overlap between a figure in the cell region extracted and a figure in the other cell region extracted; and
an output unit configured to output data on a plurality of figures overlapping.

2. An apparatus for inspecting overlapping figures comprising:
a chip overlap inspection unit configured to input a file of data on each chip of a plurality of chips arranged in a writing pattern, and inspect an existence of an overlap between each region of a plurality of chips, based on arrangement data on each region of the plurality of chips, wherein the plurality of chips are different chips to be written;
a setting unit configured to set, with respect to the plurality of chips, a plurality of cell regions for each hierarchy of the data on the each chip;

an extraction unit configured to extract, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and another cell region extracted is included in the other one of the plurality of chips where the overlap occurs;

a figure overlap judging unit configured to judge an existence of an overlap between a figure in the cell region extracted and a figure in the other cell region extracted; and an output unit configured to output data on a plurality of figures overlapping.

3. An apparatus for inspecting overlapping figures comprising:

a chip overlap inspection unit configured to input a data file on each chip of a plurality of chips which are arranged in a writing pattern and in which a plurality of hierarchies and a plurality of cell regions for each of the plurality of hierarchies are defined in such a manner that the plurality of cell regions become smaller in order according to the plurality of hierarchies, and to inspect an existence of an overlap between each region of a plurality of chips, based on arrangement data on each region of the plurality of chips, wherein the plurality of chips are different chips to be written;

an extraction unit configured to extract, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and the another cell region extracted is included in the other one of the plurality of chips where the overlap occurs;

a figure overlap judging unit configured to judge an existence of an overlap between a figure in the cell region extracted and a figure in the other cell region extracted; and an output unit configured to output data on a plurality of figures overlapping.

4. A charged particle beam writing apparatus comprising:

a chip overlap inspection unit configured to input a data file on each chip of a plurality of chips arranged in a writing pattern, and inspect an existence of an overlap between each region of a plurality of chips, based on arrangement data on each region of the plurality of chips, wherein the plurality of chips are different chips to be written;

a setting unit configured to set, with respect to the plurality of chips, a plurality of hierarchies and a plurality of cell regions of each of the plurality of hierarchies;

an extraction unit configured to extract, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and another cell region extracted is included in the other one of the plurality of chips where the overlap occurs;

a figure overlap judging unit configured to judge an existence of an overlap between a figure in the cell region extracted and a figure in the other cell region extracted;

an output unit configured to output data on a plurality of figures overlapping; and a writing unit configured to write a writing pattern in which a plurality of chips having no overlap in a figure hierarchy are arranged, onto a target workpiece by using a charged particle beam.

5. A charged particle beam writing apparatus comprising:

a chip overlap inspection unit configured to input a file of data on each chip of a plurality of chips arranged in a writing pattern, and inspect an existence of an overlap between each region of a plurality of chip regions, based on arrangement data on each region of the plurality of chips, wherein the plurality of chips are different chips to be written;

a setting unit configured to set, with respect to the plurality of chips, a plurality of cell regions for each hierarchy of the data on the each chip;

an extraction unit configured to extract, with respect to a plurality of chips where the overlap occurs, a cell region where the overlap is located, from a higher hierarchy level to a lower hierarchy level in order, wherein the plurality of chips where the overlap occurs are different chips to be written, each other, the cell region extracted is included in one of the plurality of chips where the overlap occurs and another cell region extracted is included in the other one of the plurality of chips where the overlap occurs;

a figure overlap judging unit configured to judge an existence of an overlap between a figure in the cell region extracted and a figure in the other cell region extracted;

an output unit configured to output data on a plurality of figures overlapping; and a writing unit configured to write a writing pattern in which a plurality of chips having no overlap in a figure hierarchy are arranged, onto a target workpiece by using a charged particle beam.

6. A charged particle beam writing apparatus comprising:

a judging unit configured to input a data file on each chip of a plurality of chips which are arranged in a writing pattern and in which a plurality of hierarchies and a plurality of cell regions for each of the plurality of hierarchies are defined in such a manner that the plurality of cell regions become smaller in order according to the plurality of hierarchies, and to judge an existence of an overlap between each region of a plurality of chip regions, based on arrangement data on each region of the plurality of chips, wherein the plurality of chips are different chips to be written;

an extraction unit configured to extract, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and another cell region extracted is included in the other one of the plurality of chips where the overlap occurs;

a figure overlap judging unit configured to judge an existence of an overlap between a figure in the cell region extracted and a figure in the other cell region extracted;

an output unit configured to output data on a plurality of figures overlapping; and a writing unit configured to write a writing pattern in which a plurality of chips having no overlap in a figure hierarchy are arranged, onto a target workpiece by using a charged particle beam.

7. A method for inspecting overlapping figures comprising:
inputting a data file on each chip of a plurality of chips arranged in a writing pattern, and inspecting an existence of an overlap between each region of a plurality of chips, based on arrangement data on each region of the plurality of chips, wherein the plurality of chips are different chips to be written;
setting, with respect to the plurality of chips, a plurality of hierarchies and a plurality of cell regions of each of the plurality of hierarchies;
extracting, with respect to a plurality of chips where the overlap occurs, a cell region where the overlap is located, from a higher hierarchy level to a lower hierarchy level in order; wherein the plurality of chips where the overlap occurs are different chips to be written, the cell region extracted is included in one of the plurality of chips where the overlap occurs and another cell region extracted is included in the other one of the plurality of chips where the overlap occurs;
judging, using hardware or a programmed computer, an existence of an overlap between a figure in the cell region extracted and a figure in the other cell region extracted; and
outputting data on a plurality of figures overlapping.

8. A method for inspecting overlapping figures comprising:
inputting a file of data on each chip of a plurality of chips arranged in a writing pattern, and inspecting an existence of an overlap between each region of a plurality of chips, based on arrangement data on each region of the plurality of chips, wherein the plurality of chips are different chips to be written;
setting, with respect to the plurality of chips, a plurality of cell regions for each hierarchy of the data on the each chip;
extracting, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and another cell region extracted is included in the other one of the plurality of chips where the overlap occurs;
judging, using hardware or a programmed computer, an existence of an overlap between a figure in the cell region extracted and a figure in the other cell region extracted; and
outputting data on a plurality of figures overlapping.

9. A method for inspecting overlapping figures comprising:
inputting a data file on each chip of a plurality of chips which are arranged in a writing pattern and in which a plurality of hierarchies and a plurality of cell regions for each of the plurality of hierarchies are defined in such a manner that the plurality of cell regions become smaller in order according to the plurality of hierarchies, and judging, using hardware or a programmed computer, an existence of an overlap between each region of a plurality of chip regions, based on arrangement data on each region of the plurality of chips, wherein the plurality of chips are different chips to be written;
extracting, with respect to a plurality of chips where the overlap occurs, a cell region where the overlap is located, from a higher hierarchy level to a lower hierarchy level in order, wherein the plurality of chips where the overlap occurs are different chips to be written, the cell region extracted is included in one of the plurality of chips where the overlap occurs and another cell region extracted is included in the other one of the plurality of chips where the overlap occurs;
judging an existence of an overlap between a figure in the cell region extracted and a figure in the other cell region extracted; and
outputting data on a plurality of figures overlapping.

* * * * *